United States Patent
Gutman et al.

(10) Patent No.: US 12,212,359 B2
(45) Date of Patent: Jan. 28, 2025

(54) FOCUSED DIGITAL PRE-DISTORTION WITH COMPONENT CARRIER VARIATIONS

(71) Applicant: QUALCOMM Incorporated, San Diego, CA (US)

(72) Inventors: Igor Gutman, Hod HaSharon (IL); Christian Pietsch, Nuremberg (DE)

(73) Assignee: QUALCOMM Incorporated, San Diego, CA (US)

(*) Notice: Subject to any disclaimer, the term of this patent is extended or adjusted under 35 U.S.C. 154(b) by 355 days.

(21) Appl. No.: 17/687,119

(22) Filed: Mar. 4, 2022

(65) Prior Publication Data
US 2023/0283318 A1 Sep. 7, 2023

(51) Int. Cl.
| | | |
|---|---|---|
| H04B 1/62 | (2006.01) | |
| H04B 1/04 | (2006.01) | |
| H04L 1/00 | (2006.01) | |
| H04W 52/18 | (2009.01) | |

(52) U.S. Cl.
CPC ............... *H04B 1/62* (2013.01); *H04B 1/04* (2013.01); *H04L 1/0009* (2013.01); *H04W 52/18* (2013.01); *H04B 2001/0425* (2013.01)

(58) Field of Classification Search
CPC .... H04B 1/62; H04B 1/04; H04B 2001/0425; H04L 1/0009; H04W 52/18; H03F 2200/451; H03F 3/195; H03F 3/245; H03F 1/3241
USPC .......................................................... 455/43
See application file for complete search history.

(56) References Cited

U.S. PATENT DOCUMENTS

| | | | |
|---|---|---|---|
| 9,473,286 B1* | 10/2016 | Shipley | H04L 5/001 |
| 9,882,661 B1* | 1/2018 | Gross | H04B 17/21 |
| 2016/0269057 A1* | 9/2016 | Chang | H03F 1/3241 |

OTHER PUBLICATIONS

Brihuega A., et al., "Frequency-Domain Digital Predistortion for OFDM", IEEE Microwave and Wireless Components Letters, IEEE Service Center, New York, NY, US, vol. 31, No. 6, Mar. 1, 2021, pp. 816-818, XP011859135, ISSN: 1531-1309, DOI: 10.1109/LMWC.2021.3062982, Figures 1-4.

Cunha T.R., et al., "DPD Tuning with Frequency Selective Distortion Minimization", 2015 IEEE MTT-S International Microwave Symposium, May 17, 2015, 3 Pages, XP033181268, DOI: 10.1109/MWSYM.2015.7166816, Figures 1-5.

(Continued)

*Primary Examiner* — Eugene Yun
(74) *Attorney, Agent, or Firm* — Patterson + Sheridan, L.L.P.

(57) ABSTRACT

Certain aspects of the present disclosure provide techniques for applying digital pre-distortion with frequency selectivity to a transmission signal. An example technique includes determining one or more target parameters of an input signal, the one or more target parameters being based on frequency of the input signal. The technique also includes applying digital pre-distortion with frequency selectivity to the input signal according to the one or more target parameters of the input signal to generate a resulting signal. The technique further includes processing the resulting signal to generate an analog signal for transmission and transmitting the analog signal.

20 Claims, 15 Drawing Sheets

(56) References Cited

OTHER PUBLICATIONS

Fu Z., et al., "Frequency-Selective Digital Predistortion for Unwanted Emission Reduction", IEEE Transactions on Communications, IEEE Service Center, Piscataway, NJ, USA, vol. 63, No. 1, Jan. 1, 2015, pp. 254-267, XP011569870, 15 Pages paragraph [000I] -paragraph [0VII], figures 1-13, Figures 1-13, Abstract, p. 254, Right-hand Column, Line 1-p. 266, Left-hand Column, Line 10.
International Search Report and Written Opinion—PCT/US2023/063512—ISA/EPO—Jun. 21, 2023.

\* cited by examiner

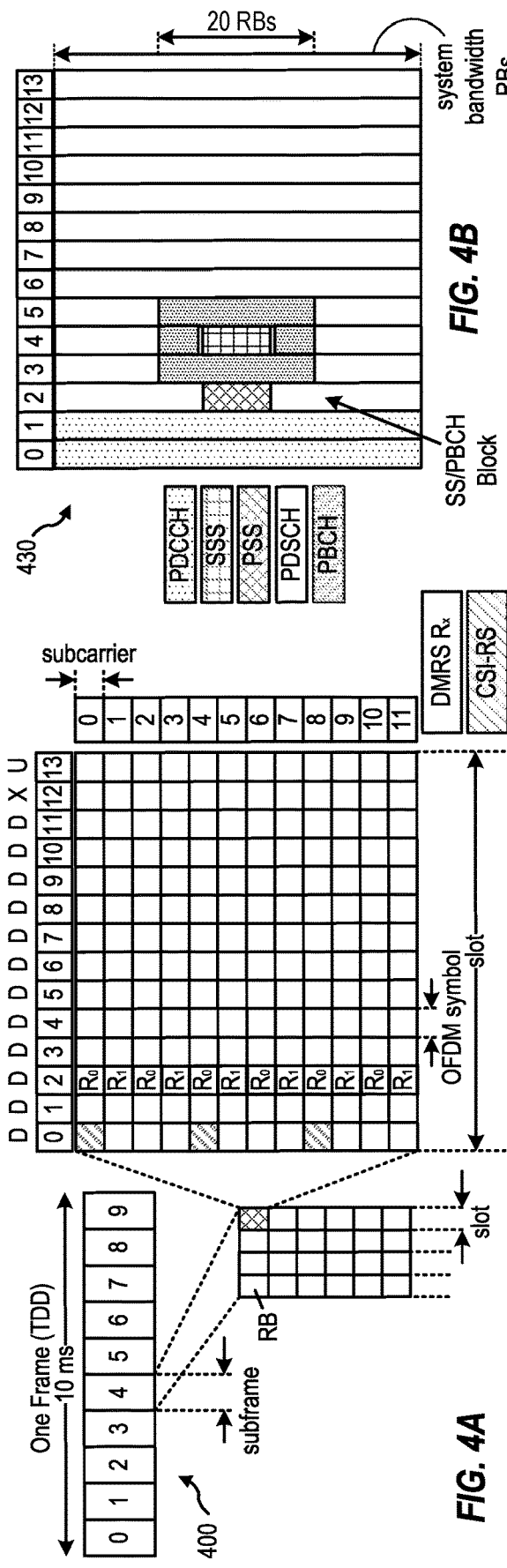
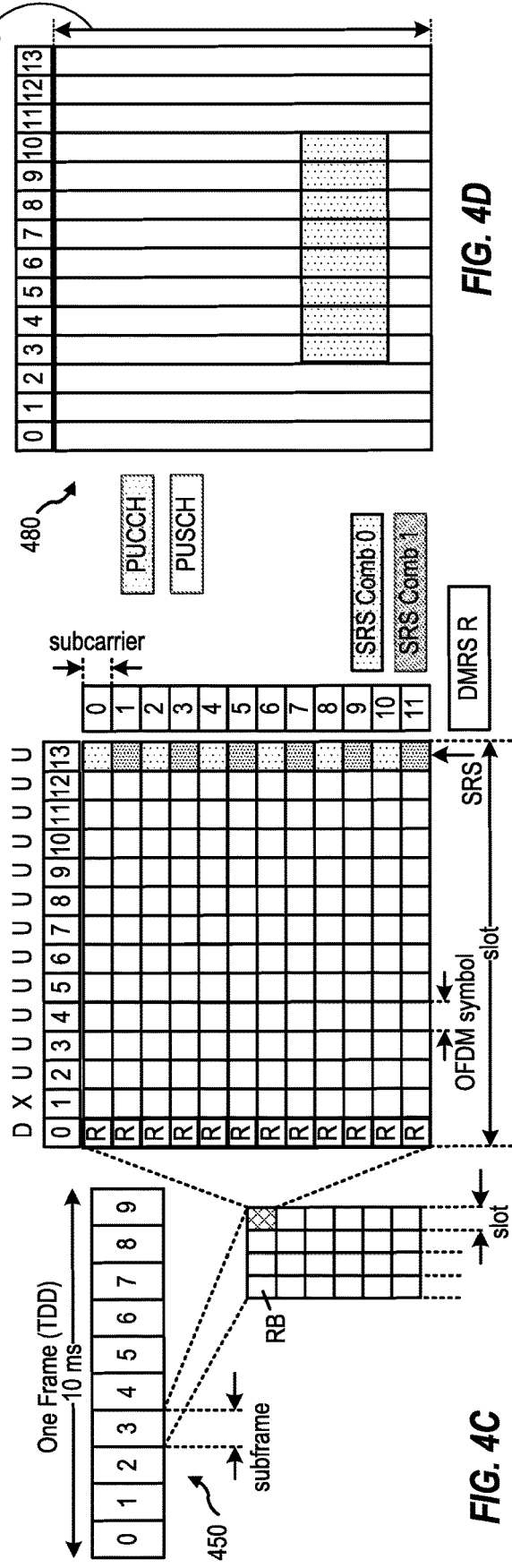

FOCUSED DIGITAL PRE-DISTORTION WITH COMPONENT CARRIER VARIATIONS

INTRODUCTION

Aspects of the present disclosure relate to wireless communications, and more particularly, to techniques for applying digital pre-distortion with frequency selectivity to transmission signals.

Wireless communication systems are widely deployed to provide various telecommunication services such as telephony, video, data, messaging, broadcasts, or other similar types of services. These wireless communication systems may employ multiple-access technologies capable of supporting communication with multiple users by sharing available system resources with those users (e.g., bandwidth, transmit power, or other resources). Multiple-access technologies can rely on any of code division, time division, frequency division orthogonal frequency division, single-carrier frequency division, or time division synchronous code division, to name a few. These and other multiple access technologies have been adopted in various telecommunication standards to provide a common protocol that enables different wireless devices to communicate on a municipal, national, regional, and even global level.

Although wireless communication systems have made great technological advancements over many years, challenges still exist. For example, it may be desirable that devices in wireless communication systems send and receive large amounts of data within a given bandwidth and that devices operate efficiently. One way to increase the device efficiency may be to use more efficient amplifiers within the device. However, these efficient amplifiers may introduce additional distortion to transmit signals and cause significant spectral re-growth. One approach is to operate these amplifiers near the non-linear region and apply pre-distortion before the amplifier to counteract the distortion introduced to transmit signals by the amplifier.

SUMMARY

One aspect provides a method for wireless communication. The method includes determining one or more target parameters of an input signal. The one or more target parameters are based on frequency of the input signal. The method also includes applying digital pre-distortion with frequency selectivity to the input signal according to the one or more target parameters of the input signal to generate a resulting signal. The method also includes processing the resulting signal to generate an analog signal for transmission. The method further includes transmitting the analog signal.

Other aspects provide: an apparatus operable, configured, or otherwise adapted to perform the aforementioned methods as well as those described elsewhere herein; a non-transitory, computer-readable media comprising instructions that, when executed by one or more processors of an apparatus, cause the apparatus to perform the aforementioned methods as well as those described elsewhere herein; a computer program product embodied on a computer-readable storage medium comprising code for performing the aforementioned methods as well as those described elsewhere herein; and an apparatus comprising means for performing the aforementioned methods as well as those described elsewhere herein. By way of example, an apparatus may comprise a processing system, a device with a processing system, or processing systems cooperating over one or more networks.

The following description and the appended figures set forth certain features for purposes of illustration.

BRIEF DESCRIPTION OF THE DRAWINGS

The appended figures depict certain features of the various aspects described herein and are not to be considered limiting of the scope of this disclosure.

FIGS. 4A, 4B, 4C, and 4D depict various example aspects of data structures for a wireless communication network.

DETAILED DESCRIPTION

Figure 1:
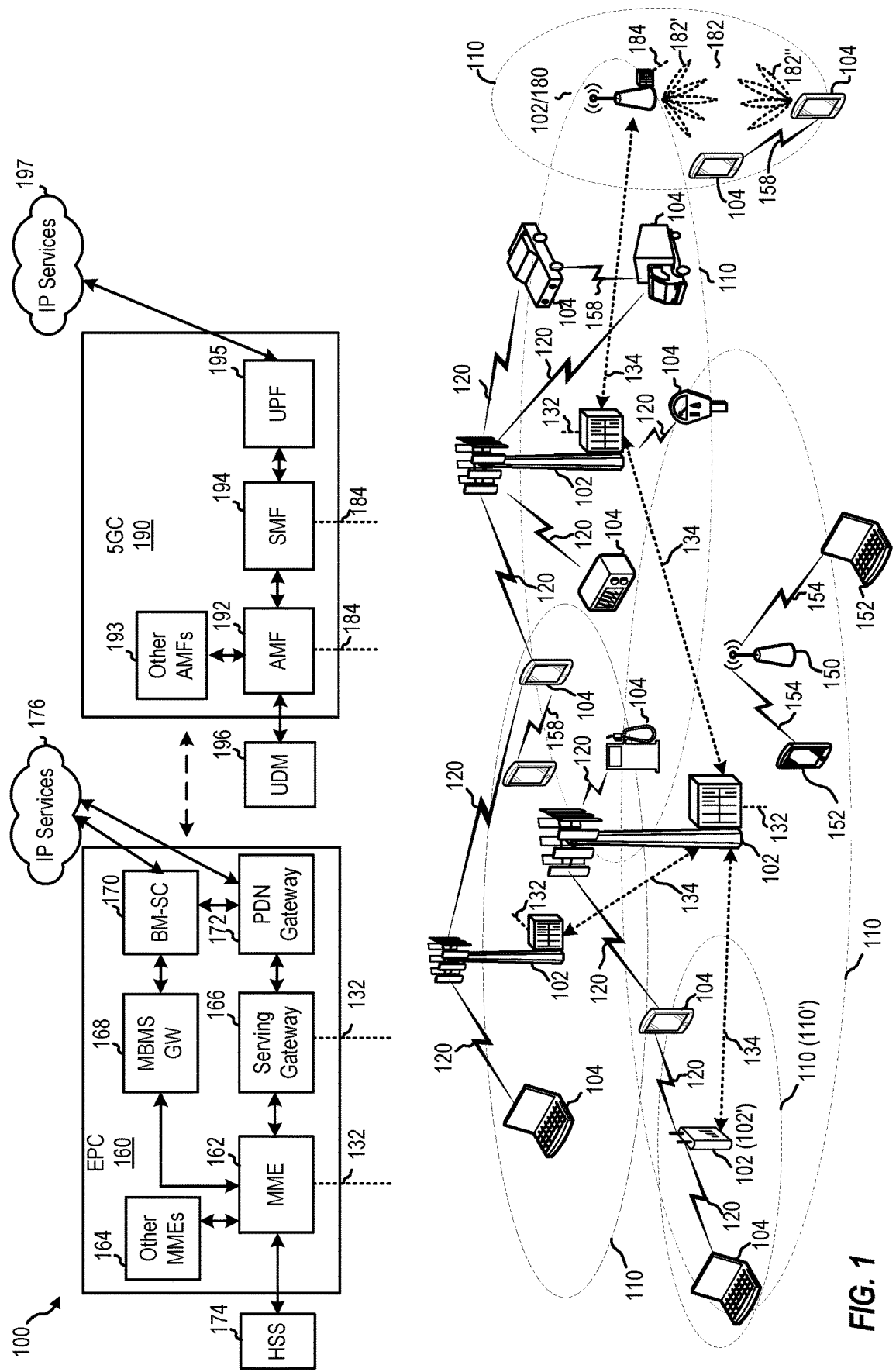
FIG. 1 depicts an example wireless communication network.

Aspects of the present disclosure provide apparatuses, methods, processing systems, and computer-readable mediums for applying digital pre-distortion (DPD) with frequency selectivity to a transmission signal having one or more component carriers (CCs). For example, aspects described herein can apply DPD that has a frequency dependent response, subject to one or more parameters of the CCs of the transmission signal, such that the quality of the transmission signal is different in particular CC(s).

In some wireless communication networks, high peak-to-average power ratio (PAPR) is increasingly a concern as it can impact the quality of a signal transmitted by a communications device. For example, some wireless communication networks, such as 5G new radio (NR), use an orthogonal frequency-division multiple access (OFDMA) digital modulation scheme. OFDMA offers multiple access by assigning subsets of subcarriers in each symbol to different users, making efficient use of radio resources. OFDMA also provides simple channel estimation at the receiver and flexibility in the utilization of time and frequency resources. However, OFDMA may result in a higher PAPR.

To address the higher PAPR, a higher constellation modulation may be used, such as 256 quadrature amplitude modulation (QAM), 1024 QAM, or 16K QAM, to spread modulation symbols across the subcarriers. For such higher constellation modulations, a high-power power amplifier (PA) may be used to amplify the signal. High-power PAs may have limited linear dynamic range and may generate non-linear components causing distortion in the signal output from the PA.

Ideally, amplifiers should be perfectly linear, which means the output signal should be an exact amplified copy of the input signal. However, real PAs are not perfectly linear because amplifying devices, such as transistors or vacuum tubes, are non-linear by nature which introduces some amount of non-linearity in the output (e.g., the amplified signal) of the PA. Non-linearity generates spectral re-growth, which leads to interference and can lead to violation of emissions standards set by regulatory bodies. Non-linearity can also lead to the degradation of the bit-error rate (BER) and data throughput of the communication system.

Non-linear distortion may be in-band and/or out-of-band. In-band distortion can impact the link performance by reducing mutual information and/or causing an increase in the error vector magnitude (EVM). EVM is a measure of the performance of a transmitter and generally is a measure of the deviation of the actual constellation points from their ideal locations in the constellation diagram. For example, a signal sent by an ideal transmitter would have all constellation points at the ideal locations; however, distortion can cause the actual constellation points to deviate from the ideal locations. Thus, large values of EVM typically indicate greater distance between measured and ideal points, which in turn, indicates a higher probability of bit errors. Out-of-band distortion causes degradation of the adjacent channel leakage ratio (ACLR) and may result in interference. ACLR is the ratio of the transmitted power on the assigned channel to the power received in the adjacent radio channel.

One technique of reducing non-linearity in a PA is back-off (BO), where the PA is operated at a lower power level to "back off" the amplified signal power. Operating the PA at a lower power level helps ensure that the PA operates in the linear region. However, the power back-off reduces the efficiency of the PA. For example, as the power back-off to the PA increases, less power is transmitted to the medium.

Another technique of reducing non-linearity in a PA is DPD, which can be used in addition to, or as an alternative to, power back-off. DPD is a technique where inverse distortion is applied, using a pre-distorter, before an input signal reaches the PA to cancel the distortion generated by the PA. By using the pre-distorter in the transmitter's digital front end, the distortion introduced to transmit signals by the PA can be kept at a target level, reducing the need for power back-off and improving the efficiency of the PA.

One issue with conventional DPD is that this type of DPD can lead to reduced performance in wireless communication network deployments with multiple CCs. For example, some wireless communication networks, such as 5G NR, may support transmitting signals with multiple CCs. Due to frequency selectivity, each CC may experience a different channel. Consequently, in wireless communication networks that support multiple CCs, the communications device may transmit signals with different characteristics, depending on the channel conditions of the different CCs. For example, CCs that experience a small propagation loss may be transmitted with a higher modulation and coding scheme or rank (MCS/rank) (e.g., a higher constellation modulation) and lower power, whereas CCs that experience a higher propagation loss may be transmitted with a lower MCS/rank (e.g., a lower constellation modulation) and higher power. When conventional DPD is applied in these multiple CC scenarios, it does not consider the variations between the different CCs in terms of allocated power for each CC, EVM per CC, MCS/rank per CC, etc. Hence, applying DPD in these situations can depress the performance in one or more of the CCs that experience a lower propagation loss, negatively impacting the performance of the network.

To address this, aspects described herein provide techniques for applying DPD with frequency selectivity to a transmission signal, such that the quality of the transmission signal (e.g., EVM, power, etc.) may be different between two or more frequency bands (e.g., component carriers) of the transmission signal. As described in greater detail below, in certain aspects, a communications device may determine one or more target parameters of an input signal where the one or more target parameters are based on the frequency of the input signal. The target parameters can include, but are not limited to, a transmission power allocated to each CC of the signal, a MCS/rank (e.g., including constellation modulation) assigned to each CC of the signal, a target EVM (e.g., maximum allowed EVM) for each CC of the signal, etc.

The communications device may apply DPD with frequency selectivity to the input signal according to the one or more target parameters of the input signal to generate a resulting signal. The resulting signal may be processed to generate an analog signal for transmission, and the analog signal may be transmitted. By applying frequency-selective DPD in this manner, aspects described herein can significantly improve the performance in particular frequency bands (e.g., CCs in which there is a small propagation loss) without negatively impacting the performance in other frequency bands.

Introduction to Wireless Communication Networks

The techniques and methods described herein may be used for various wireless communications networks. While aspects may be described herein using terminology commonly associated with 3G, 4G, and/or 5G wireless technologies, aspects of the present disclosure may likewise be applicable to other communication systems and standards not explicitly mentioned herein.

FIG. 1 depicts an example of a wireless communication network 100, in which aspects described herein may be implemented.

Generally, wireless communication network 100 includes various network entities (alternatively, network elements or network nodes). A network entity is generally a communications device and/or a communication function performed by a communications device. For example, various functions of a network as well as various devices associated with and interacting with a network may be considered network entities.

In the depicted example, wireless communication network 100 includes base stations (BSs) 102, user equipments (UEs) 104, and one or more core networks, such as an Evolved Packet Core (EPC) 160 and 5G Core (5GC) network 190, which interoperate to provide communications services over various communications links, including wired and wireless links.

FIG. 1 depicts various example UEs 104, which may more generally include: a cellular phone, smart phone, session initiation protocol (SIP) phone, laptop, personal digital assistant (PDA), satellite radio, global positioning system, multimedia device, video device, digital audio player, camera, game console, tablet, smart device, wearable device, vehicle, electric meter, gas pump, large or small kitchen appliance, healthcare device, implant, sensor/actuator, display, internet of things (IoT) devices, always on (AON) devices, edge processing devices, or other similar devices. UEs 104 may also be referred to more generally as a mobile device, a wireless device, a wireless communications device, a station, a mobile station, a subscriber station, a mobile subscriber station, a mobile unit, a subscriber unit, a wireless unit, a remote unit, a remote device, an access terminal, a mobile terminal, a wireless terminal, a remote terminal, a handset, and others.

BSs 102 wirelessly communicate with UEs 104 via communications links 120. The communication links 120 between BSs 102 and UEs 104 may include uplink (UL) (also referred to as reverse link) transmissions from a UE 104 to a BS 102 and/or downlink (DL) (also referred to as forward link) transmissions from a BS 102 to a UE 104. The communication links 120 may use multiple-input and multiple-output (MIMO) antenna technology, including spatial multiplexing, beamforming, and/or transmit diversity in various aspects.

BSs 102 may generally include: a NodeB, enhanced NodeB (eNB), next generation enhanced NodeB (ng-eNB), next generation NodeB (gNB or gNodeB), access point, base transceiver station, radio base station, radio transceiver, transceiver function, transmission reception point, and others. Each of BSs 102 may provide communication coverage for a respective geographic coverage area 110, which may sometimes be referred to as a cell, and which may overlap in some cases (e.g., small cell 102' may have a coverage area 110' that overlaps the coverage area 110 of a macro cell). A BS may, for example, provide communication coverage for a macro cell (covering relatively large geographic area), a pico cell (covering relatively smaller geographic area, such as a sports stadium), a femto cell (relatively smaller geographic area (e.g., a home)), and/or other types of cells.

Figure 2:
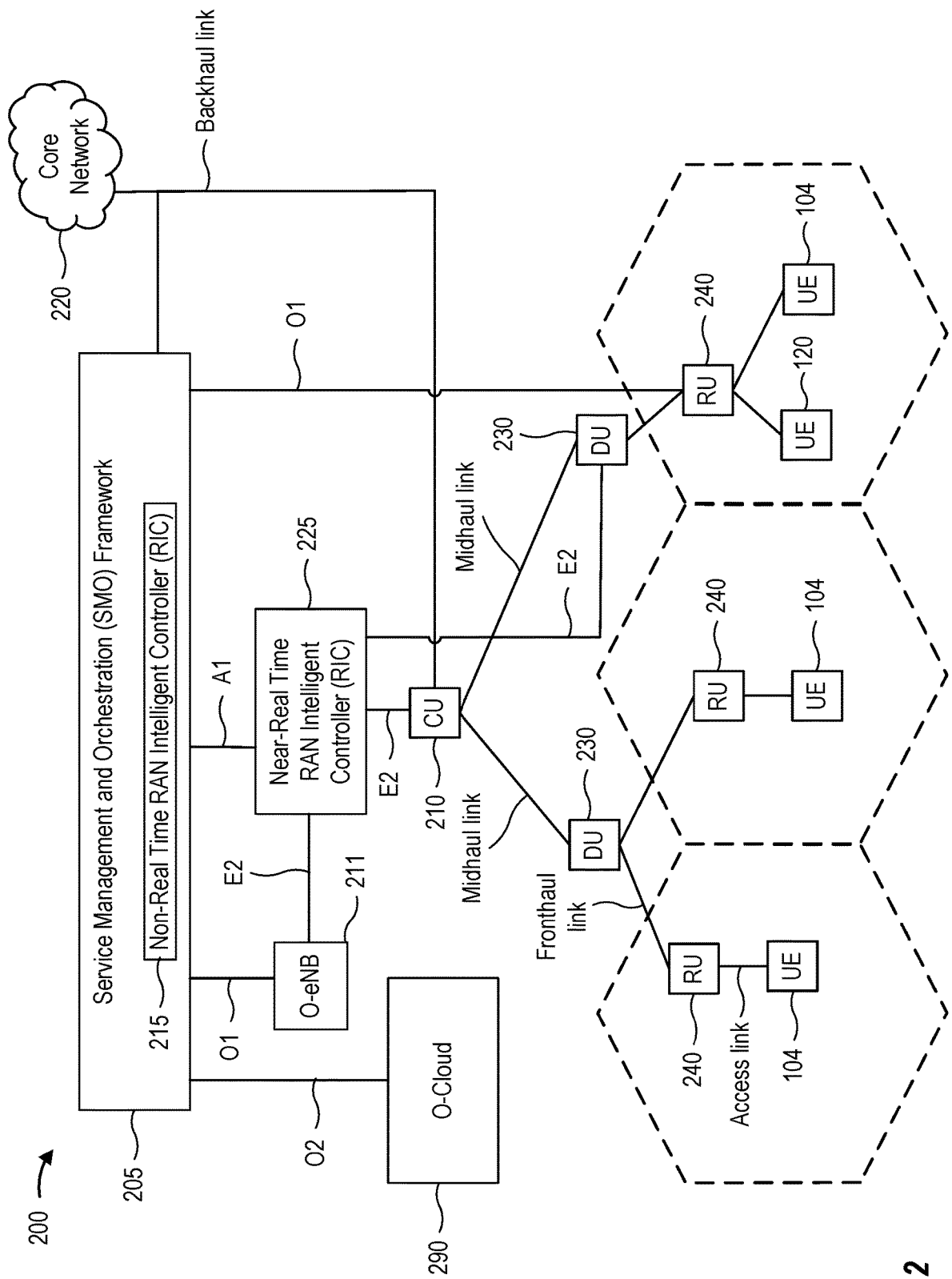
FIG. 2 depicts an example disaggregated base station architecture.

While BSs 102 are depicted in various aspects as unitary communications devices, BSs 102 may be implemented in various configurations. For example, one or more components of base station may be disaggregated, including a central unit (CU), one or more distributed units (DUs), one or more radio units (RUs), a radio unit (RU), a Near-Real Time (Near-RT) RAN Intelligent Controller (RIC), or a Non-Real Time (Non-RT) MC, to name a few examples. In another example, various aspects of a base station may be virtualized. More generally, a base station (e.g., BS 102) may include components that are located at a single physical location or components located at various physical locations. In examples in which a base station includes components that are located at various physical locations, the various components may each perform functions such that, collectively, the various components achieve functionality that is similar to a base station that is located at a single physical location. In some aspects, a base station including components that are located at various physical locations may be referred to as a disaggregated radio access network architecture, such as an Open RAN (O-RAN) or Virtualized RAN (VRAN) architecture. FIG. 2 depicts and describes an example disaggregated base station architecture.

Different BSs 102 within wireless communication network 100 may also be configured to support different radio access technologies, such as 3G, 4G, and 5G. For example, BSs 102 configured for 4G LTE (collectively referred to as Evolved Universal Mobile Telecommunications System (UMTS) Terrestrial Radio Access Network (E-UTRAN)) may interface with the EPC 160 through first backhaul links 132 (e.g., an S1 interface). BSs 102 configured for 5G (e.g., 5G NR or Next Generation RAN (NG-RAN)) may interface with 5GC 190 through second backhaul links 184. BSs 102 may communicate directly or indirectly (e.g., through the EPC 160 or 5GC 190) with each other over third backhaul links 134 (e.g., X2 interface), which may be wired or wireless.

Wireless communication network 100 may subdivide the electromagnetic spectrum into various classes, bands, channels, or other features. In some aspects, the subdivision is provided based on wavelength and frequency, where frequency may also be referred to as a carrier, a subcarrier, a frequency channel, a tone, or a subband. For example, 3GPP currently defines Frequency Range 1 (FR1) as including 600 MHz-6 GHz, which is often referred to (interchangeably) as "Sub-6 GHz". Similarly, 3GPP currently defines Frequency Range 2 (FR2) as including 26-41 GHz, which is sometimes referred to (interchangeably) as a "millimeter wave" ("mmW" or "mmWave"). A base station configured to communicate using mmWave/near mmWave radio frequency bands (e.g., a mmWave base station such as BS 180) may utilize beamforming (e.g., 182) with a UE (e.g., 104) to improve path loss and range.

The communication links 120 between BSs 102 and, for example, UEs 104, may be through one or more carriers, which may have different bandwidths (e.g., 5, 10, 15, 20, 100, 400, and other MHz), and which may be aggregated in various aspects. Carriers may or may not be adjacent to each other. Allocation of carriers may be asymmetric with respect to DL and UL (e.g., more or fewer carriers may be allocated for DL than for UL).

Communications using higher frequency bands may have higher path loss and a shorter range compared to lower frequency communications. Accordingly, certain base stations (e.g., 180 in FIG. 1) may utilize beamforming 182 with a UE 104 to improve path loss and range. For example, BS 180 and the UE 104 may each include a plurality of antennas, such as antenna elements, antenna panels, and/or antenna arrays to facilitate the beamforming. In some cases, BS 180 may transmit a beamformed signal to UE 104 in one or more transmit directions 182'. UE 104 may receive the beamformed signal from the base station 180 in one or more receive directions 182". UE 104 may also transmit a beamformed signal to the base station 180 in one or more transmit directions 182". BS 180 may also receive the beamformed signal from UE 104 in one or more receive directions 182'. Base station 180 and UE 104 may then perform beam training to determine the best receive and transmit directions for each of BS 180 and UE 104. Notably, the transmit and receive directions for BS 180 may or may not be the same. Similarly, the transmit and receive directions for UE 104 may or may not be the same.

Wireless communication network 100 further includes a Wi-Fi AP 150 in communication with Wi-Fi stations (STAs) 152 via communication links 154 in, for example, a 2.4 GHz and/or 5 GHz unlicensed frequency spectrum.

Certain UEs 104 may communicate with each other using device-to-device (D2D) communication link 158. D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH).

EPC 160 may include various functional components, including: a Mobility Management Entity (MME) 162, other MMES 164, a Serving Gateway 166, a Multimedia Broadcast Multicast Service (MBMS) Gateway 168, a Broadcast Multicast Service Center (BM-SC) 170, and a Packet Data Network (PDN) Gateway 172 in the depicted example. MME 162 may be in communication with a Home Subscriber Server (HSS) 174. MME 162 is the control node that processes the signaling between the UEs 104 and the EPC 160. Generally, MME 162 provides bearer and connection management.

Generally, user Internet protocol (IP) packets are transferred through Serving Gateway 166, which itself is connected to PDN Gateway 172. PDN Gateway 172 provides UE IP address allocation as well as other functions. PDN Gateway 172 and the BM-SC 170 are connected to IP Services 176, which may include, for example, the Internet, an intranet, an IP Multimedia Subsystem (IMS), a Packet Switched (PS) streaming service, and/or other IP services.

BM-SC 170 may provide functions for MBMS user service provisioning and delivery. BM-SC 170 may serve as an entry point for content provider MBMS transmission, may be used to authorize and initiate MBMS Bearer Services within a public land mobile network (PLMN), and may be used to schedule MBMS transmissions. MBMS Gateway 168 may be used to distribute MBMS traffic to the BSs 102 belonging to a Multicast Broadcast Single Frequency Network (MBSFN) area broadcasting a particular service, and may be responsible for session management (start/stop) and for collecting eMBMS related charging information.

5GC 190 may include various functional components, including: an Access and Mobility Management Function (AMF) 192, other AMFs 193, a Session Management Function (SMF) 194, and a User Plane Function (UPF) 195. AMF 192 may be in communication with Unified Data Management (UDM) 196.

AMF 192 is a control node that processes signaling between UEs 104 and 5GC 190. AMF 192 provides, for example, quality of service (QoS) flow and session management.

Internet protocol (IP) packets are transferred through UPF 195, which is connected to the IP Services 197, and which provides UE IP address allocation as well as other functions for 5GC 190. IP Services 197 may include, for example, the Internet, an intranet, an IMS, a PS streaming service, and/or other IP services.

In various aspects, a network entity or network node can be implemented as an aggregated base station, as a disaggregated base station, an integrated access and backhaul (IAB) node, a relay node, a sidelink node, to name a few examples.

FIG. 2 depicts an example disaggregated base station 200 architecture. The disaggregated base station 200 architecture may include one or more central units (CUs) 210 that can communicate directly with a core network 220 via a backhaul link, or indirectly with the core network 220 through one or more disaggregated base station units (such as a Near-Real Time (Near-RT) RAN Intelligent Controller (MC) 225 via an E2 link, or a Non-Real Time (Non-RT) RIC 215 associated with a Service Management and Orchestration (SMO) Framework 205, or both). A CU 210 may communicate with one or more distributed units (DUs) 230 via respective midhaul links, such as an F1 interface. The DUs 230 may communicate with one or more radio units (RUs) 240 via respective fronthaul links. The RUs 240 may communicate with respective UEs 104 via one or more radio frequency (RF) access links. In some implementations, the UE 104 may be simultaneously served by multiple RUs 240.

Each of the units, e.g., the CUs 210, the DUs 230, the RUs 240, as well as the Near-RT RICs 225, the Non-RT RICs 215 and the SMO Framework 205, may include one or more interfaces or be coupled to one or more interfaces configured to receive or transmit signals, data, or information (collectively, signals) via a wired or wireless transmission medium. Each of the units, or an associated processor or controller providing instructions to the communication interfaces of the units, can be configured to communicate with one or more of the other units via the transmission medium. For example, the units can include a wired interface configured to receive or transmit signals over a wired transmission medium to one or more of the other units. Additionally, the units can include a wireless interface, which may include a receiver, a transmitter or transceiver (such as a radio frequency (RF) transceiver), configured to receive or transmit signals, or both, over a wireless transmission medium to one or more of the other units.

In some aspects, the CU 210 may host one or more higher layer control functions. Such control functions can include radio resource control (RRC), packet data convergence protocol (PDCP), service data adaptation protocol (SDAP), or the like. Each control function can be implemented with an interface configured to communicate signals with other control functions hosted by the CU 210. The CU 210 may be configured to handle user plane functionality (e.g., Central Unit-User Plane (CU-UP)), control plane functionality (e.g., Central Unit-Control Plane (CU-CP)), or a combination thereof. In some implementations, the CU 210 can be logically split into one or more CU-UP units and one or more CU-CP units. The CU-UP unit can communicate bidirectionally with the CU-CP unit via an interface, such as the E1 interface when implemented in an O-RAN configuration. The CU 210 can be implemented to communicate with the DU 230, as necessary, for network control and signaling.

The DU 230 may correspond to a logical unit that includes one or more base station functions to control the operation of one or more RUs 240. In some aspects, the DU 230 may host one or more of a radio link control (RLC) layer, a medium access control (MAC) layer, and one or more high physical (PHY) layers (such as modules for forward error correction (FEC) encoding and decoding, scrambling, modulation and demodulation, or the like) depending, at least in part, on a functional split, such as those defined by the $3^{rd}$ Generation Partnership Project (3GPP). In some aspects, the DU 230 may further host one or more low PHY layers. Each layer (or module) can be implemented with an interface configured to communicate signals with other layers (and modules) hosted by the DU 230, or with the control functions hosted by the CU 210.

Lower-layer functionality can be implemented by one or more RUs 240. In some deployments, an RU 240, controlled by a DU 230, may correspond to a logical node that hosts RF processing functions, or low-PHY layer functions (such as performing fast Fourier transform (FFT), inverse FFT (iFFT), digital beamforming, physical random access channel (PRACH) extraction and filtering, or the like), or both, based at least in part on the functional split, such as a lower layer functional split. In such an architecture, the RU(s) 240 can be implemented to handle over the air (OTA) communication with one or more UEs 104. In some implementations, real-time and non-real-time aspects of control and user plane communication with the RU(s) 240 can be controlled by the corresponding DU 230. In some scenarios, this configuration can enable the DU(s) 230 and the CU 210 to be implemented in a cloud-based RAN architecture, such as a vRAN architecture.

The SMO Framework 205 may be configured to support RAN deployment and provisioning of non-virtualized and virtualized network elements. For non-virtualized network elements, the SMO Framework 205 may be configured to support the deployment of dedicated physical resources for RAN coverage requirements which may be managed via an operations and maintenance interface (such as an O1 interface). For virtualized network elements, the SMO Framework 205 may be configured to interact with a cloud computing platform (such as an open cloud (O-Cloud) 290) to perform network element life cycle management (such as to instantiate virtualized network elements) via a cloud computing platform interface (such as an O2 interface). Such virtualized network elements can include, but are not limited to, CUs 210, DUs 230, RUs 240 and Near-RT RICs 225. In some implementations, the SMO Framework 205 can communicate with a hardware aspect of a 4G RAN, such as an open eNB (O-eNB) 211, via an O1 interface. Additionally, in some implementations, the SMO Framework 205 can communicate directly with one or more RUs 240 via an O1 interface. The SMO Framework 205 also may include a Non-RT RIC 215 configured to support functionality of the SMO Framework 205.

The Non-RT RIC 215 may be configured to include a logical function that enables non-real-time control and optimization of RAN elements and resources, Artificial Intelligence/Machine Learning (AI/ML) workflows including model training and updates, or policy-based guidance of applications/features in the Near-RT RIC 225. The Non-RT RIC 215 may be coupled to or communicate with (such as via an A1 interface) the Near-RT RIC 225. The Near-RT RIC 225 may be configured to include a logical function that enables near-real-time control and optimization of RAN elements and resources via data collection and actions over an interface (such as via an E2 interface) connecting one or more CUs 210, one or more DUs 230, or both, as well as an O-eNB, with the Near-RT RIC 225.

In some implementations, to generate AI/ML models to be deployed in the Near-RT RIC 225, the Non-RT RIC 215 may receive parameters or external enrichment information from external servers. Such information may be utilized by the Near-RT RIC 225 and may be received at the SMO Framework 205 or the Non-RT RIC 215 from non-network data sources or from network functions. In some examples, the Non-RT RIC 215 or the Near-RT RIC 225 may be configured to tune RAN behavior or performance. For example, the Non-RT RIC 215 may monitor long-term trends and patterns for performance and employ AI/ML models to perform corrective actions through the SMO Framework 205 (such as reconfiguration via O1) or via creation of RAN management policies (such as A1 policies).

Figure 3:
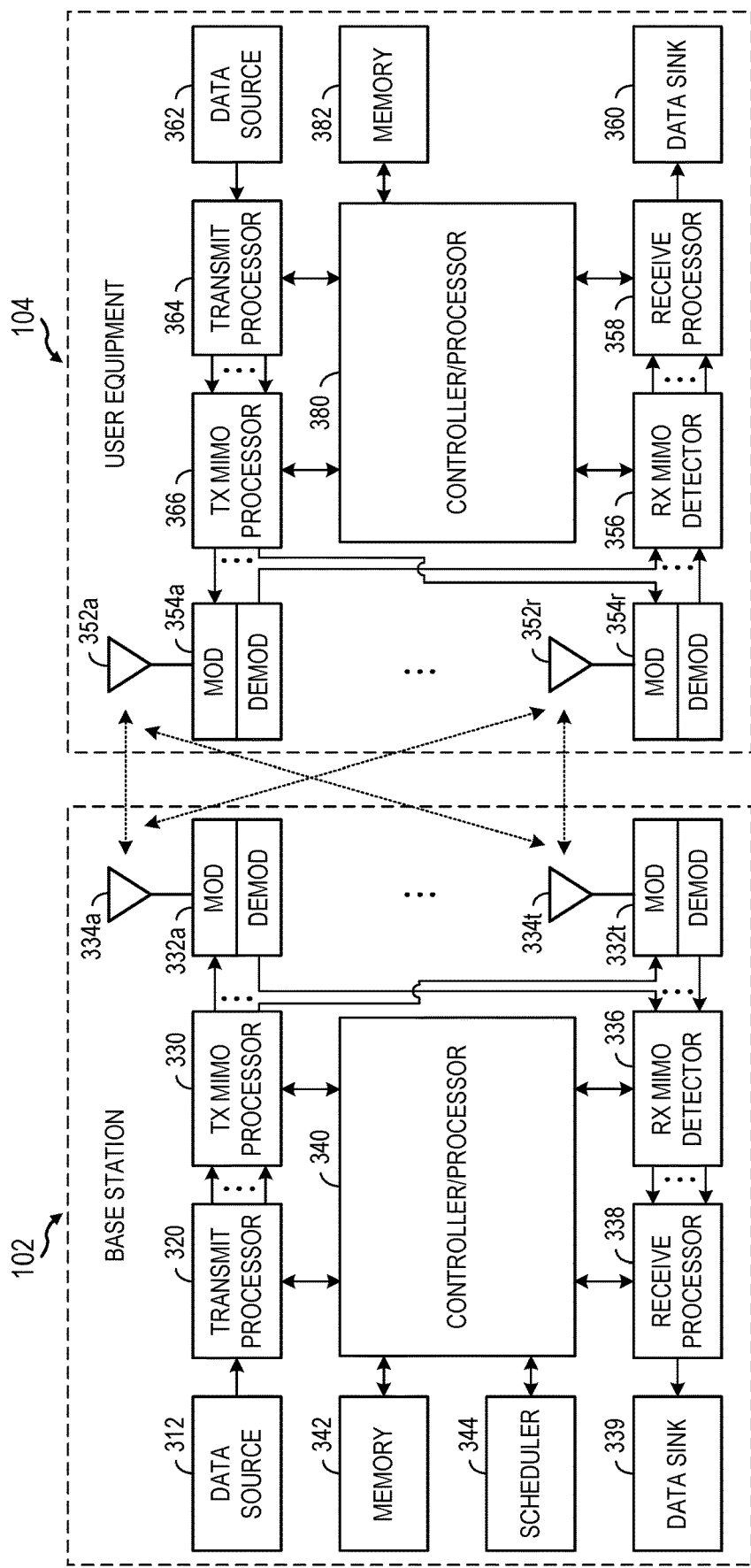
FIG. 3 depicts aspects of an example base station and an example user equipment.

FIG. 3 depicts aspects of an example BS 102 and a UE 104.

Generally, BS 102 includes various processors (e.g., 320, 330, 338, and 340), antennas 334a-t (collectively 334), transceivers 332a-t (collectively 332), which include modulators and demodulators, and other aspects, which enable wireless transmission of data (e.g., data source 312) and wireless reception of data (e.g., data sink 339). For example, BS 102 may send and receive data between BS 102 and UE 104. BS 102 includes controller/processor 340, which may be configured to implement various functions described herein related to wireless communications.

Generally, UE 104 includes various processors (e.g., 358, 364, 366, and 380), antennas 352a-r (collectively 352), transceivers 354a-r (collectively 354), which include modulators and demodulators, and other aspects, which enable wireless transmission of data (e.g., data source 362) and wireless reception of data (e.g., data sink 360). UE 104 includes controller/processor 380, which may be configured to implement various functions described herein related to wireless communications.

In regards to an example downlink transmission, BS 102 includes a transmit processor 320 that may receive data from a data source 312 and control information from a controller/processor 340. The control information may be for the physical broadcast channel (PBCH), physical control format indicator channel (PCFICH), physical HARQ indicator channel (PHICH), physical downlink control channel (PDCCH), group common PDCCH (GC PDCCH), and others. The data may be for the physical downlink shared channel (PDSCH), in some examples.

Transmit processor 320 may process (e.g., encode and symbol map) the data and control information to obtain data symbols and control symbols, respectively. Transmit processor 320 may also generate reference symbols, such as for the primary synchronization signal (PSS), secondary synchronization signal (SSS), PBCH demodulation reference signal (DMRS), and channel state information reference signal (CSI-RS).

Transmit (TX) multiple-input multiple-output (MIMO) processor 330 may perform spatial processing (e.g., precoding) on the data symbols, the control symbols, and/or the reference symbols, if applicable, and may provide output symbol streams to the modulators (MODs) in transceivers 332a-332t. Each modulator in transceivers 332a-332t may process a respective output symbol stream to obtain an output sample stream. Each modulator may further process (e.g., convert to analog, amplify, filter, and upconvert) the output sample stream to obtain a downlink signal. Downlink signals from the modulators in transceivers 332a-332t may be transmitted via the antennas 334a-334t, respectively.

In order to receive the downlink transmission, UE 104 includes antennas 352a-352r that may receive the downlink signals from the BS 102 and may provide received signals to the demodulators (DEMODs) in transceivers 354a-354r, respectively. Each demodulator in transceivers 354a-354r may condition (e.g., filter, amplify, downconvert, and digitize) a respective received signal to obtain input samples. Each demodulator may further process the input samples to obtain received symbols.

MIMO detector 356 may obtain received symbols from all the demodulators in transceivers 354a-354r, perform MIMO detection on the received symbols if applicable, and provide detected symbols. Receive processor 358 may process (e.g., demodulate, deinterleave, and decode) the detected symbols, provide decoded data for the UE 104 to a data sink 360, and provide decoded control information to a controller/processor 380.

In regards to an example uplink transmission, UE 104 further includes a transmit processor 364 that may receive and process data (e.g., for the PUSCH) from a data source 362 and control information (e.g., for the physical uplink control channel (PUCCH)) from the controller/processor 380. Transmit processor 364 may also generate reference symbols for a reference signal (e.g., for the sounding reference signal (SRS)). The symbols from the transmit processor 364 may be precoded by a TX MIMO processor 366 if applicable, further processed by the modulators in transceivers 354a-354r (e.g., for SC-FDM), and transmitted to BS 102.

At BS 102, the uplink signals from UE 104 may be received by antennas 334a-t, processed by the demodulators in transceivers 332a-332t, detected by a MIMO detector 336 if applicable, and further processed by a receive processor 338 to obtain decoded data and control information sent by UE 104. Receive processor 338 may provide the decoded data to a data sink 339 and the decoded control information to the controller/processor 340.

Memories 342 and 382 may store data and program codes for BS 102 and UE 104, respectively.

Scheduler 344 may schedule UEs for data transmission on the downlink and/or uplink.

In various aspects, BS 102 may be described as transmitting and receiving various types of data associated with the methods described herein. In these contexts, "transmitting" may refer to various mechanisms of outputting data, such as outputting data from data source 312, scheduler 344, memory 342, transmit processor 320, controller/processor 340, TX MIMO processor 330, transceivers 332a-t, antenna 334a-t, and/or other aspects described herein. Similarly, "receiving" may refer to various mechanisms of obtaining data, such as obtaining data from antennas 334a-t, transceivers 332a-t, RX MIMO detector 336, controller/processor 340, receive processor 338, scheduler 344, memory 342, and other aspects described herein.

In various aspects, UE 104 may likewise be described as transmitting and receiving various types of data associated with the methods described herein. In these contexts, "transmitting" may refer to various mechanisms of outputting data, such as outputting data from data source 362, memory 382, transmit processor 364, controller/processor 380, TX MIMO processor 366, transceivers 354a-t, antenna 352a-t, and/or other aspects described herein. Similarly, "receiving" may refer to various mechanisms of obtaining data, such as obtaining data from antennas 352a-t, transceivers 354a-t, RX MIMO detector 356, controller/processor 380, receive processor 358, memory 382, and other aspects described herein.

In some aspects, a processor may be configured to perform various operations, such as those associated with the methods described herein, and transmit (output) to or receive (obtain) data from another interface that is configured to transmit or receive, respectively, the data.

FIGS. 4A, 4B, 4C, and 4D depict aspects of data structures for a wireless communication network, such as wireless communication network 100 of FIG. 1.

In particular, FIG. 4A is a diagram 400 illustrating an example of a first subframe within a 5G (e.g., 5G NR) frame structure, FIG. 4B is a diagram 430 illustrating an example of DL channels within a 5G subframe, FIG. 4C is a diagram 450 illustrating an example of a second subframe within a 5G frame structure, and FIG. 4D is a diagram 480 illustrating an example of UL channels within a 5G subframe.

Wireless communication systems may utilize orthogonal frequency division multiplexing (OFDM) with a cyclic prefix (CP) on the uplink and downlink. Such systems may also support half-duplex operation using time division duplexing (TDD). OFDM and single-carrier frequency division multiplexing (SC-FDM) partition the system bandwidth (e.g., as depicted in FIGS. 4B and 4D) into multiple orthogonal subcarriers. Each subcarrier may be modulated with data. Modulation symbols may be sent in the frequency domain with OFDM and in the time domain with SC-FDM.

A wireless communication frame structure may be frequency division duplex (FDD), in which for a particular set of subcarriers and subframes within the set of subcarriers are dedicated for either DL or UL. Wireless communication frame structures may also be time division duplex (TDD), in which for a particular set of subcarriers and subframes within the set of subcarriers are dedicated for both DL and UL.

In FIGS. 4A and 4C, the wireless communication frame structure is TDD where D is DL, U is UL, and X is flexible for use between DL/UL. UEs may be configured with the slot format through a received slot format indicator (SFI) (dynamically through DL control information (DCI), or semi-statically/statically through radio resource control (RRC) signaling). In the depicted examples, a 10 ms frame is divided into 10 equally sized 1 ms subframes. Each subframe may include one or more time slots. In some examples, each slot may include 7 or 14 symbols, depending on the slot configuration. Subframes may also include mini-slots, which generally have fewer symbols than an entire slot. Other wireless communication technologies may have a different frame structure and/or different channels.

Generally, the number of slots within a subframe is based on a slot configuration and a numerology. For slot configuration 0, different numerologies ($\mu$) 0 to 5 allow for 1, 2, 4, 8, 16, and 32 slots, respectively, per subframe. For slot configuration 1, different numerologies 0 to 2 allow for 2, 4, and 8 slots, respectively, per subframe. Accordingly, for slot configuration 0 and numerology $\mu$, there are 14 symbols/slot and 2 $\mu$ slots/subframe. The subcarrier spacing and symbol length/duration are a function of the numerology. The subcarrier spacing may be equal to $2^{\mu} \times 15$ kHz, where $\mu$ is the numerology 0 to 5. As such, the numerology $\mu=0$ has a subcarrier spacing of 15 kHz and the numerology $\mu=5$ has a subcarrier spacing of 480 kHz. The symbol length/duration is inversely related to the subcarrier spacing. FIGS. 4A, 4B, 4C, and 4D provide an example of slot configuration 0 with 14 symbols per slot and numerology $\mu=2$ with 4 slots per subframe. The slot duration is 0.25 ms, the subcarrier spacing is 60 kHz, and the symbol duration is approximately 16.67 $\mu$s.

As depicted in FIGS. 4A, 4B, 4C, and 4D, a resource grid may be used to represent the frame structure. Each time slot includes a resource block (RB) (also referred to as physical RBs (PRBs)) that extends 12 consecutive subcarriers. The resource grid is divided into multiple resource elements (REs). The number of bits carried by each RE depends on the modulation scheme.

As illustrated in FIG. 4A, some of the REs carry reference (pilot) signals (RS) for a UE (e.g., UE 104 of FIGS. 1 and 3). The RS may include demodulation RS (DMRS) and channel state information reference signals (CSI-RS) for channel estimation at the UE. The RS may also include beam measurement RS (BRS), beam refinement RS (BRRS), and phase tracking RS (PT-RS).

FIG. 4B illustrates an example of various DL channels within a subframe of a frame. The physical downlink control channel (PDCCH) carries DCI within one or more control channel elements (CCEs), each CCE including nine RE groups (REGs), each REG including four consecutive REs in an OFDM symbol.

A primary synchronization signal (PSS) may be within symbol 2 of particular subframes of a frame. The PSS is used by a UE (e.g., 104 of FIGS. 1 and 3) to determine subframe/symbol timing and a physical layer identity.

A secondary synchronization signal (SSS) may be within symbol 4 of particular subframes of a frame. The SSS is used by a UE to determine a physical layer cell identity group number and radio frame timing.

Based on the physical layer identity and the physical layer cell identity group number, the UE can determine a physical cell identifier (PCI). Based on the PCI, the UE can determine the locations of the aforementioned DMRS. The physical broadcast channel (PBCH), which carries a master information block (MIB), may be logically grouped with the PSS and SSS to form a synchronization signal (SS)/PBCH block. The MIB provides a number of RBs in the system bandwidth and a system frame number (SFN). The physical downlink shared channel (PDSCH) carries user data, broadcast system information not transmitted through the PBCH such as system information blocks (SIBs), and paging messages.

As illustrated in FIG. 4C, some of the REs carry DMRS (indicated as R for one particular configuration, but other DMRS configurations are possible) for channel estimation at the base station. The UE may transmit DMRS for the PUCCH and DMRS for the PUSCH. The PUSCH DMRS may be transmitted, for example, in the first one or two symbols of the PUSCH. The PUCCH DMRS may be transmitted in different configurations depending on whether short or long PUCCHs are transmitted and depending on the particular PUCCH format used. UE 104 may also transmit sounding reference signals (SRS). The SRS may be transmitted, for example, in the last symbol of a subframe. The SRS may have a comb structure, and a UE may transmit SRS on one of the combs. The SRS may be used by a base station for channel quality estimation to enable frequency-dependent scheduling on the UL.

FIG. 4D illustrates an example of various UL channels within a subframe of a frame. The PUCCH may be located as indicated in one configuration. The PUCCH carries uplink control information (UCI), such as scheduling requests, a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), and/or UCI.

Aspects Related to Focused DPD with CC Variations

Utilization efficiency of a resource, such as radiated power, plays a significant role in wireless communication systems. As discussed herein, some wireless communication systems (e.g., wireless communication network 100) include a transmitter (e.g., a BS 102 or a UE 104) with non-linear components, such as high-power PAs with generally limited linear dynamic range. These non-linear components may distort the transmitted signal.

Figure 5:
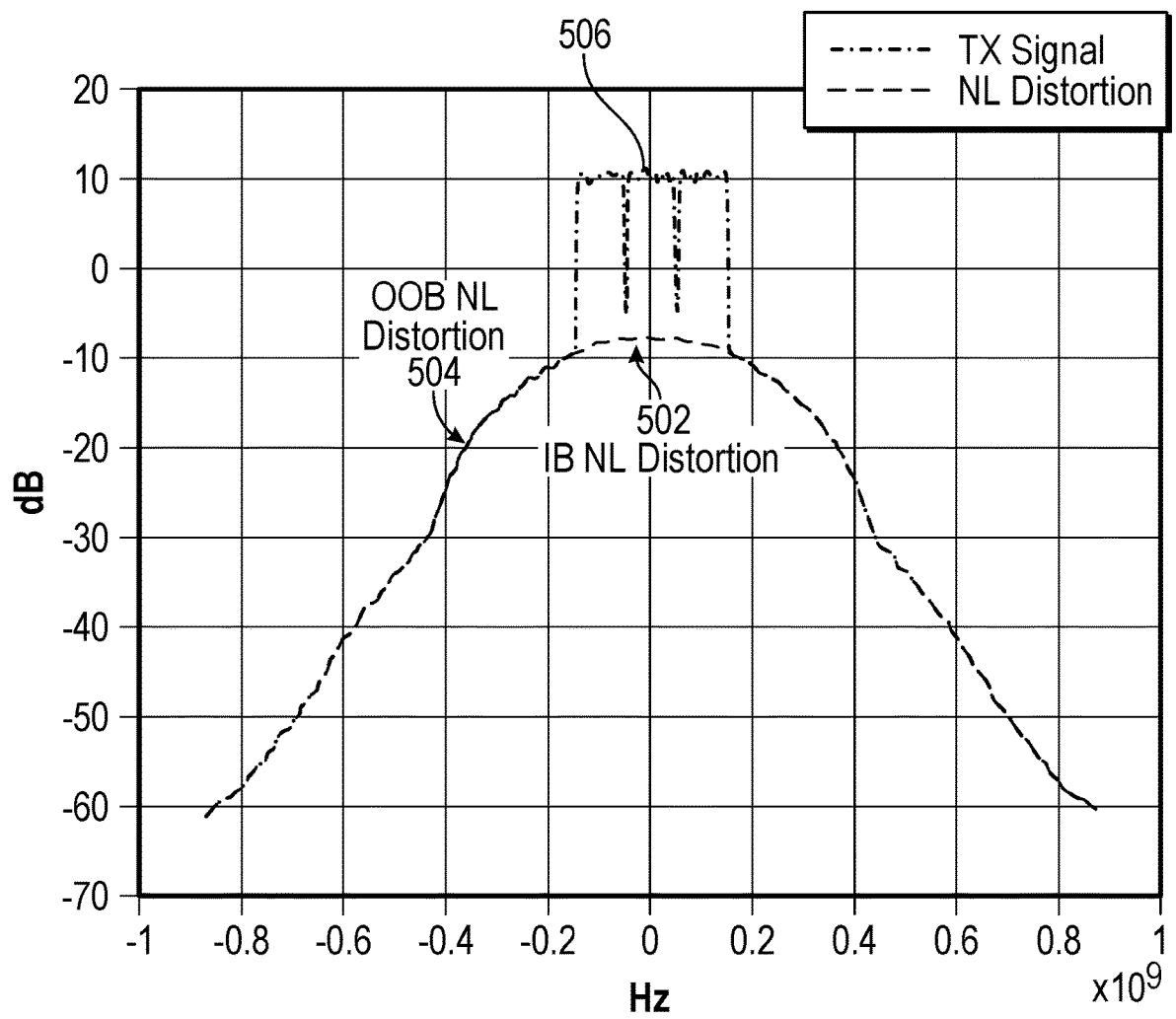
FIG. 5 depicts in-band distortion and out-of-band distortion of a transmission signal.

The non-linear distortions may be classified as in-band distortions or out-of-band distortions. In-band distortion affects link performance in the sense of mutual information and/or EVM. Out-of-band distortion dictates the amount of adjacent channel interference (ACI) or how much the main transmission channel interferes with an adjacent channel. FIG. 5 depicts an example of in-band distortion 502 and out-of-band distortion 504 to a transmission signal 506.

To avoid these distortions in some cases, power back-off may be introduced. However, the power back-off comes with a cost: the higher the back-off, the lower the power efficiency. With a lower power efficiency, less power is transmitted to the medium, which can be problematic.

Figure 6:
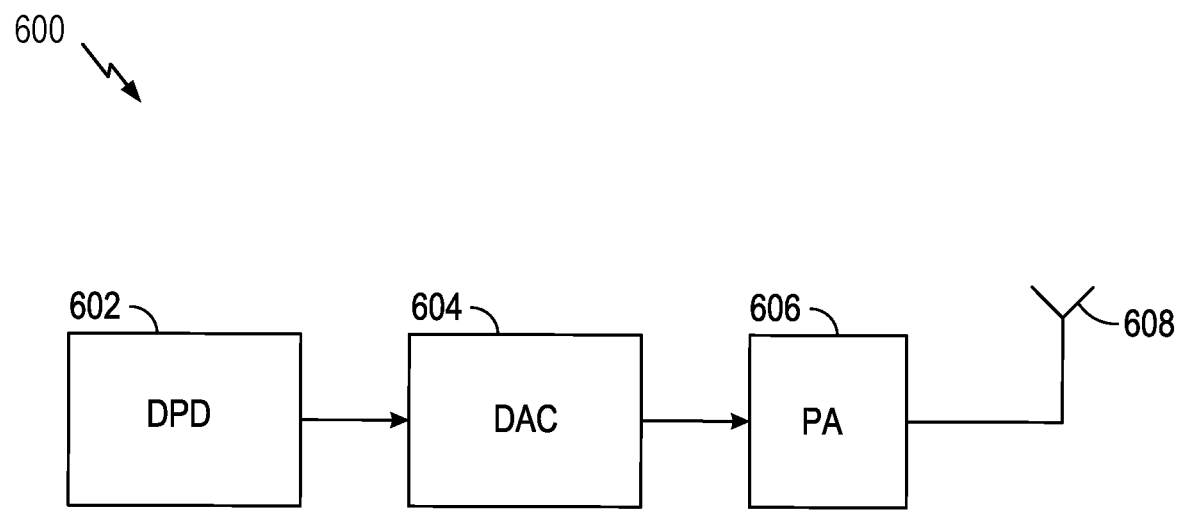
FIG. 6 is a block diagram conceptually illustrating an example transmit chain.

Another technique to avoid non-linear distortions involves using DPD in the transmitter's digital front end. Using DPD, the amount of distortion may be kept at a target level, while the power back-off is reduced to be as low as possible and, hence, the PA efficiency may be improved. FIG. 6 illustrates an example transmit chain 600 having a DPD 602 (also referred to as a digital pre-distorter or a digital pre-distorter circuit). Generally, a communications device generates a signal to transmit using transmit chain 600. The signal starts in the digital domain before being converted to the analog domain by a digital-to-analog converter (DAC) 604, being processed in the analog domain (e.g., being filtered and upconverted to a radio frequency (RF) signal), and being sent to a PA 606. The PA 606 sends the analog signal to the antenna 608 for transmission.

Figure 7:
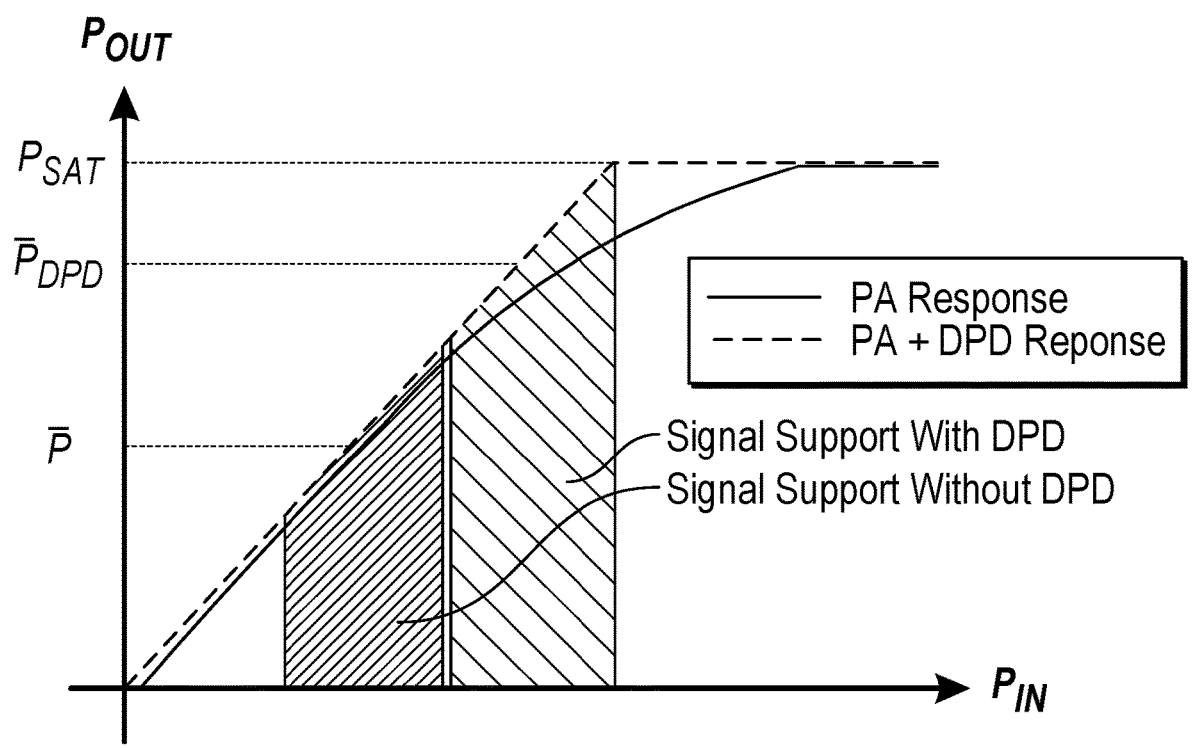
FIG. 7 depicts frequency response of a power amplifier (PA) with digital pre-distortion (DPD) and without DPD.

DPDs feature linearization capabilities, preserve overall efficiency, and take advantage of advances in digital signal processors (DSPs) and analog-to-digital converters (ADCs). Generally, a DPD adds an expanding nonlinearity in the baseband that complements compressing characteristics of the PA. The cascade of the DPD and the PA becomes linear, and the original input is amplified by a constant gain. With DPD, the PA may be used up to its saturation point, $P_{SAT}$, while maintaining linearity as shown in FIG. 7 for a given input signal power, $P_{IN}$, and applied DPD, $P_{DPD}$, thus increasing efficiency. The DPD may be considered as an "inverse" of the PA.

In 5G NR, the number of CCs that can be supported by the network has been increased relative to 4G. For example, 5G NR may support up to 1.4 GHz instantaneous bandwidth (IBW) with 10 CCs. While the number of CCs supported by 5G NR has been increased relative to 4G, the PA that is applied may still be shared.

Due to frequency selectivity, each CC may experience a different channel. Because of this, a communications device may be configured (or instructed) to transmit the CCs with different power, in inverse to the propagation loss of the channel that the CC is expected to experience. Generally, the CCs that are expected to experience a small propagation loss may be de-boosted (e.g., transmitted with lower power), while the CCs that are expected to experience a higher propagation loss may be transmitted with higher power. The de-boosted CC(s) may be allocated a higher MCS/rank, whereas the CC(s) with higher power may be allocated a lower MCS/rank.

Figure 8:
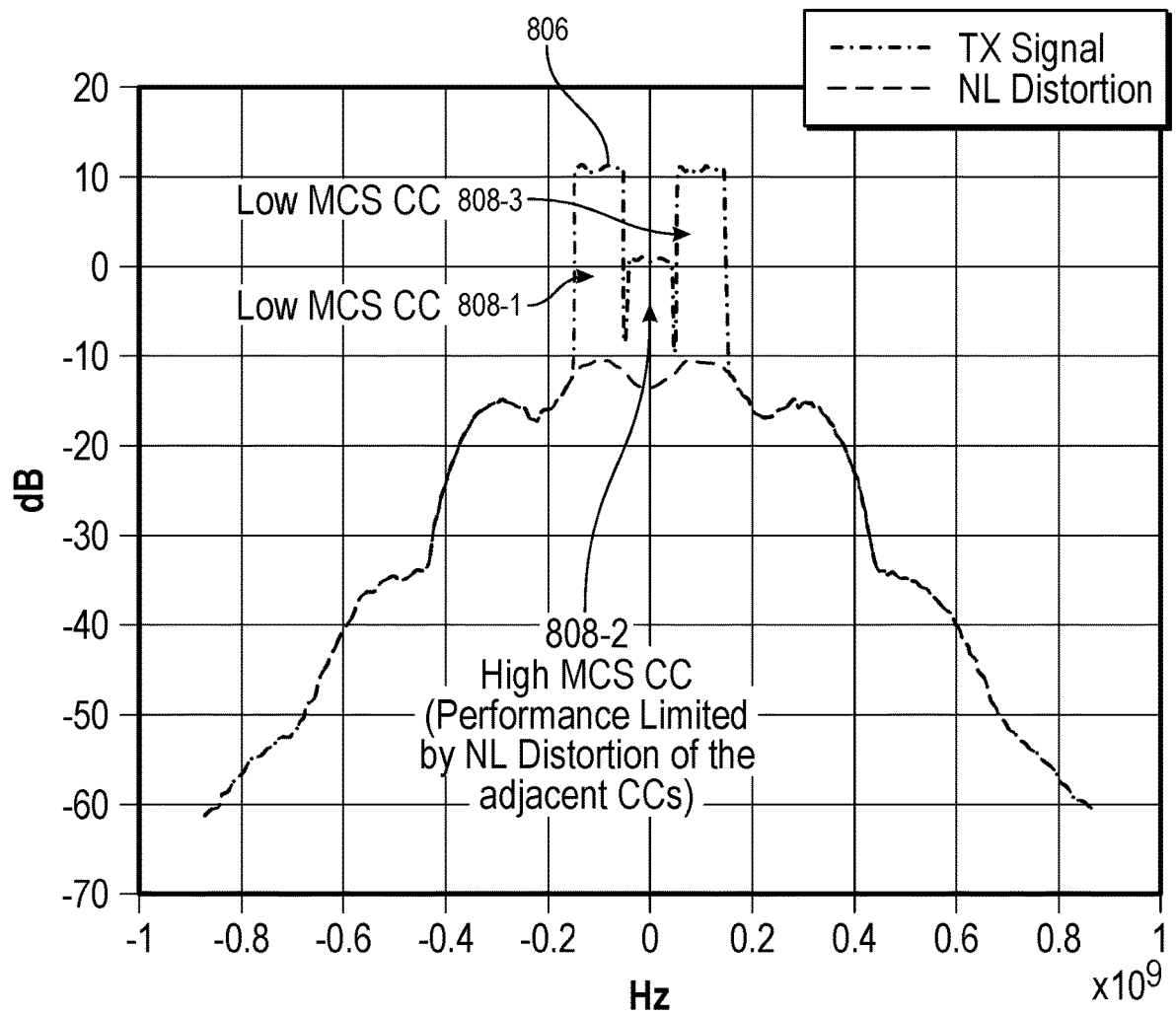
FIG. 8 depicts an example of transmit power variation between different component carriers of a transmission signal.

Consider, for example, the scenario depicted in FIG. 8, which depicts an example of the transmit power variation between multiple CCs 808 of a transmission signal 806 (labeled "TX signal"). Here, CC 808-2 may experience a "good" channel (e.g., a channel expected to experience a small amount of propagation loss), and therefore, CC 808-2 may be transmitted with a high MCS and with a low transmission power. On the other hand, CCs 808-1 and 808-3 may experience a "poor" channel (e.g., a channel expected to experience a large amount of propagation loss), and therefore, CCs 808-1 and 808-3 may be transmitted with a lower MCS (relative to CC 808-2) and with a higher power (relative to CC 808-2). In this scenario, the out-of-band leakage of the "poor" CCs 808-1 and 808-3 is depressing the performance of the "good" CC 808-2, as shown by the non-linear distortion curve (labeled "NL distortion").

Each CC may have a respective target EVM (e.g., maximum allowed EVM) that is determined based in part on the MCS and/or power of the CC. In some cases, the target EVM may be specified in a wireless communication standard. For example, certain wireless standards (e.g., 5G NR, 802.11, etc.) may specify the target EVM that is to be applied for a given transmitter's power, MCS, etc. Generally, higher order modulation schemes may have a stricter target EVM (e.g., a lower maximum allowed EVM) than lower order modulation schemes. In the scenario depicted in FIG. 8, for example, CC 808-2 may have a lower target EVM than CCs 808-1 and 808-3, since CC 808-2 is transmitted with a higher MCS/lower power than CCs 808-1 and 808-3.

Figure 9:
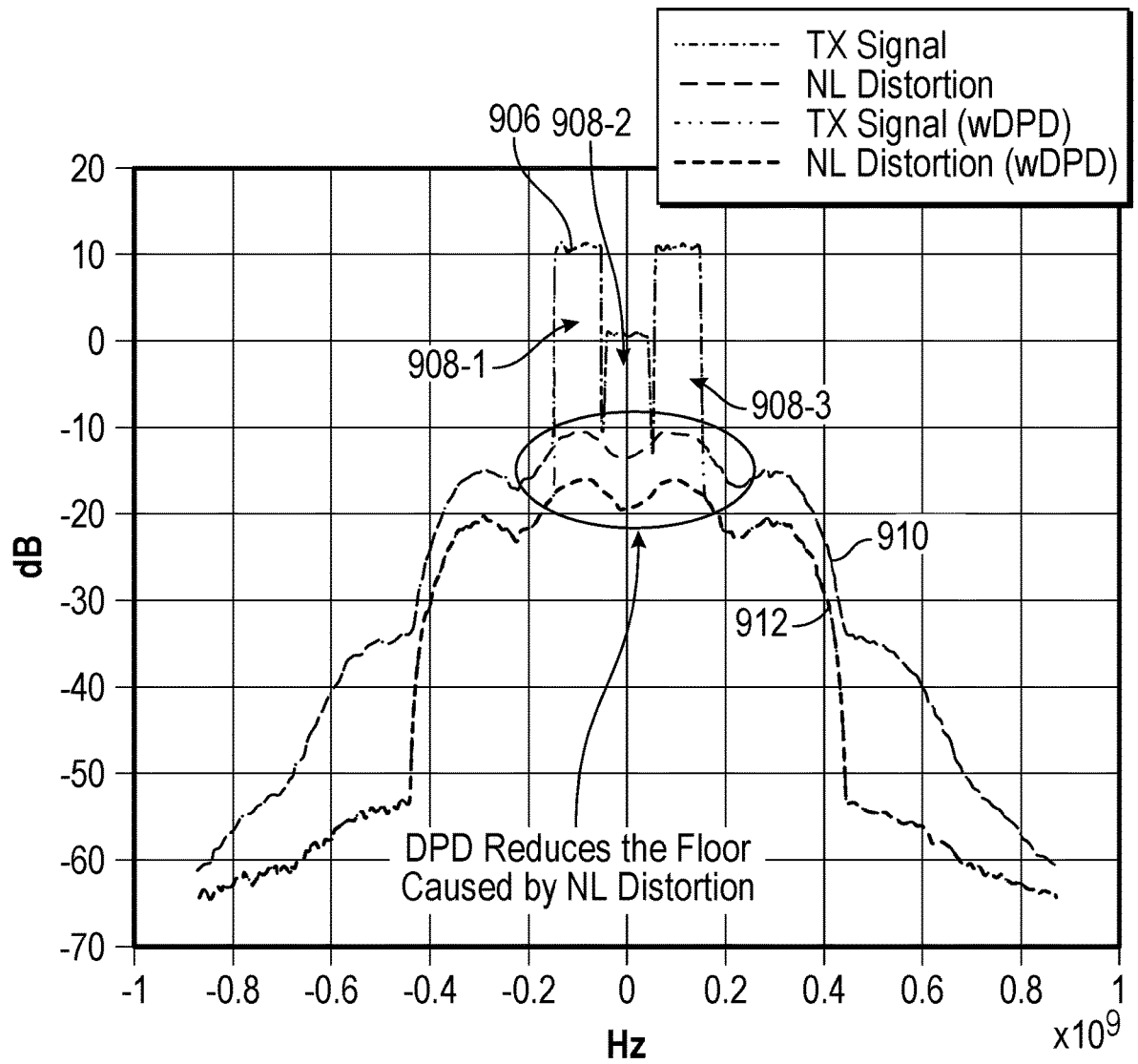
FIG. 9 depicts an example of reduction in non-linear distortion with DPD applied equally across multiple component carriers.

In some wireless communication networks that support communication with multiple CCs, DPD can be applied to reduce the impact of the out-of-band leakage from particular "poor" CC(s) on the "good" CC(s). However, because conventional DPD techniques generally do not consider the target EVM per CC, the CC's power, and other properties or parameters for each CC, using conventional DPD across multiple CCs can compromise the performance of one or more of the CCs. Consider, for example, the scenario depicted in FIG. 9, which depicts an example of reduction in non-linear distortion across CCs 908-1, 908-2, and 908-3 of a transmission signal 906 (labeled "TX signal (wDPD)") with DPD applied equally to all CCs 908-1, 908-2, and 908-3 of the transmission signal 906. Here, the conventional DPD cleans the non-linear distortion in the same manner in the CCs with low and high power, as well as in the out-of-band frequencies, in which there is no allocation. That is, the conventional DPD does not consider the target parameters of the individual CCs, including, for example, the target EVM per CC, the allocated transmission power for each CC, etc.

However, while conventional DPD may reduce the floor caused by the NL distortion across CC 908 1-3 (e.g., NL distortion 912 with DPD is smaller than NL distortion 910 without DPD), the performance gains from this approach may not be able to make up for the performance degradation experienced by particular CCs, such as CC 908-2, when DPD is applied in this manner. In the particular example depicted in FIG. 9, the conventional DPD may be able to improve the distortion by up to 6 dB. However, this improvement in distortion may not be sufficient because the power difference between the CCs may be greater than 6 dB. Consequently, it may be desirable to provide improved techniques for applying DPD to transmission signals having multiple CCs with different parameters (or properties).

Aspects of the present disclosure provide a frequency-selective DPD that can target particular frequency bands (e.g., CCs), based on parameters (or properties) of the bands. That is, aspects can apply DPD in a frequency-selective manner, subject to one or more parameters of the CCs of the transmission signal, such that the quality of the transmission signal may be different between two or more frequency bands (e.g., CCs). The parameters for each CC can include, but are not limited to, power allocated to the CC, a target EVM for the CC (e.g., a maximum allowed EVM for the CC), a MCS assigned to the CC, a rank assigned for the CC, etc.

Figure 10:
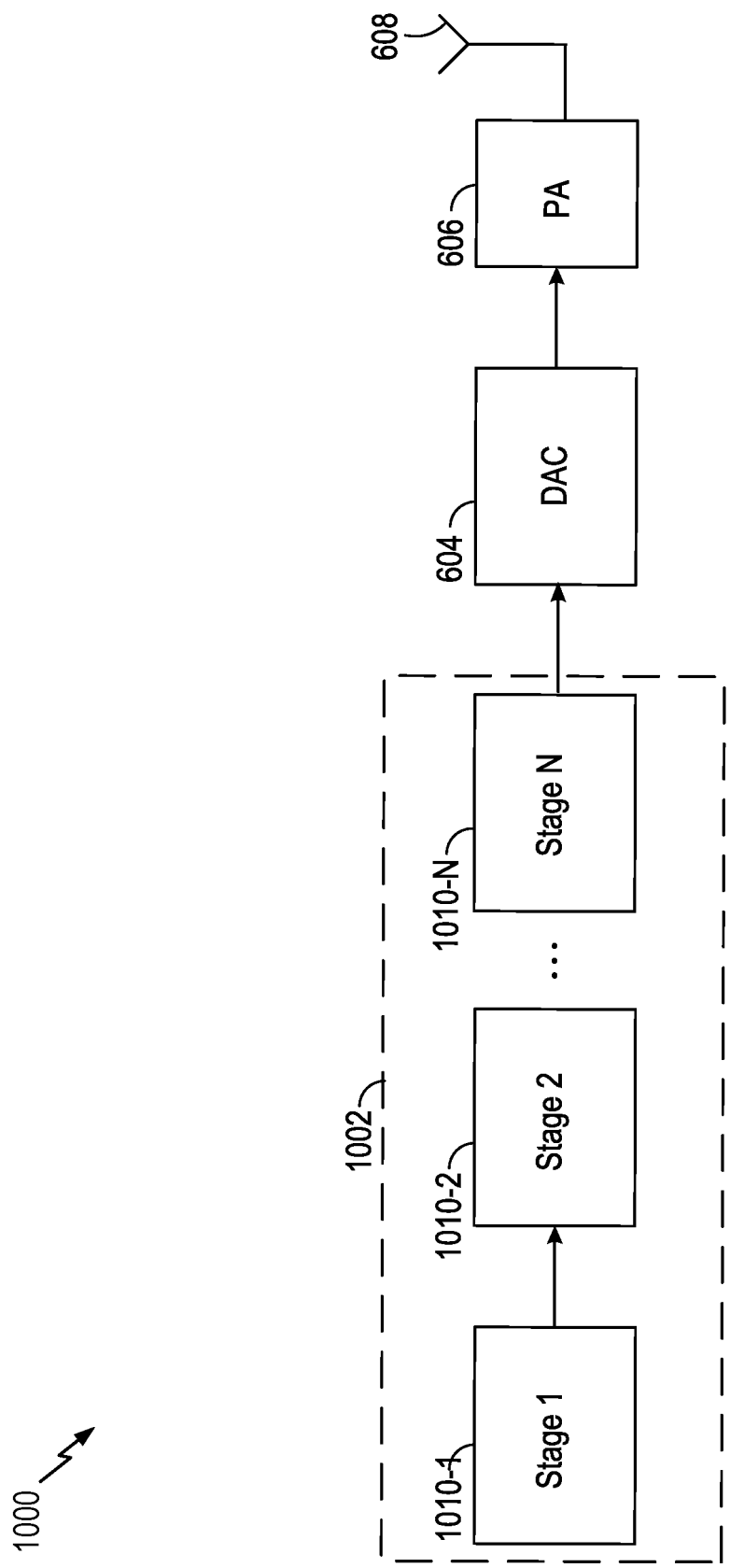
FIG. 10 depicts a transmit chain with iterative frequency-selective DPD circuit stages.

In certain aspects, the frequency-selective DPD described herein may be implemented using one or more iterative frequency-selective DPD stages. FIG. 10 depicts a transmit chain 1000 with N iterative frequency-selective DPD circuit stages 1010-1 to 1010-N (collectively referred to as "iterative frequency-selective DPD circuit stages 1010"). The stages 1010 are included as part of a DPD 1002, which may be similar to DPD 602. Note that the iterative frequency-selective DPD circuit stages 1010 illustrated in FIG. 10 are provided as a reference example implementation for applying DPD in a frequency-selective manner, which is not intended as the sole implementation for applying DPD in a frequency-selective manner, as other techniques/circuits for applying DPD in a frequency-selective manner can be used.

Each of the additional stages (e.g., stage 1010-2 to stage 1010-N) may be a duplicate of stage 1010-1. In certain aspects, the frequency-selective DPD described herein can target particular CCs using any number of stages/iterations (e.g., a single stage/iteration, two stages/iterations, three stages/iterations, etc.). In general, using additional stages/iterations may lead to better performance at the cost of increasing the amount of hardware that is used, and vice versa. Because each stage/iteration is implemented in the time domain and may be implemented without a fast Fourier transform (FFT), the complexity of the solution generally increases linearly with the number of stages/iterations, while the complexity of each stage/iteration is typically equal to the complexity of a single conventional DPD.

Figure 11:
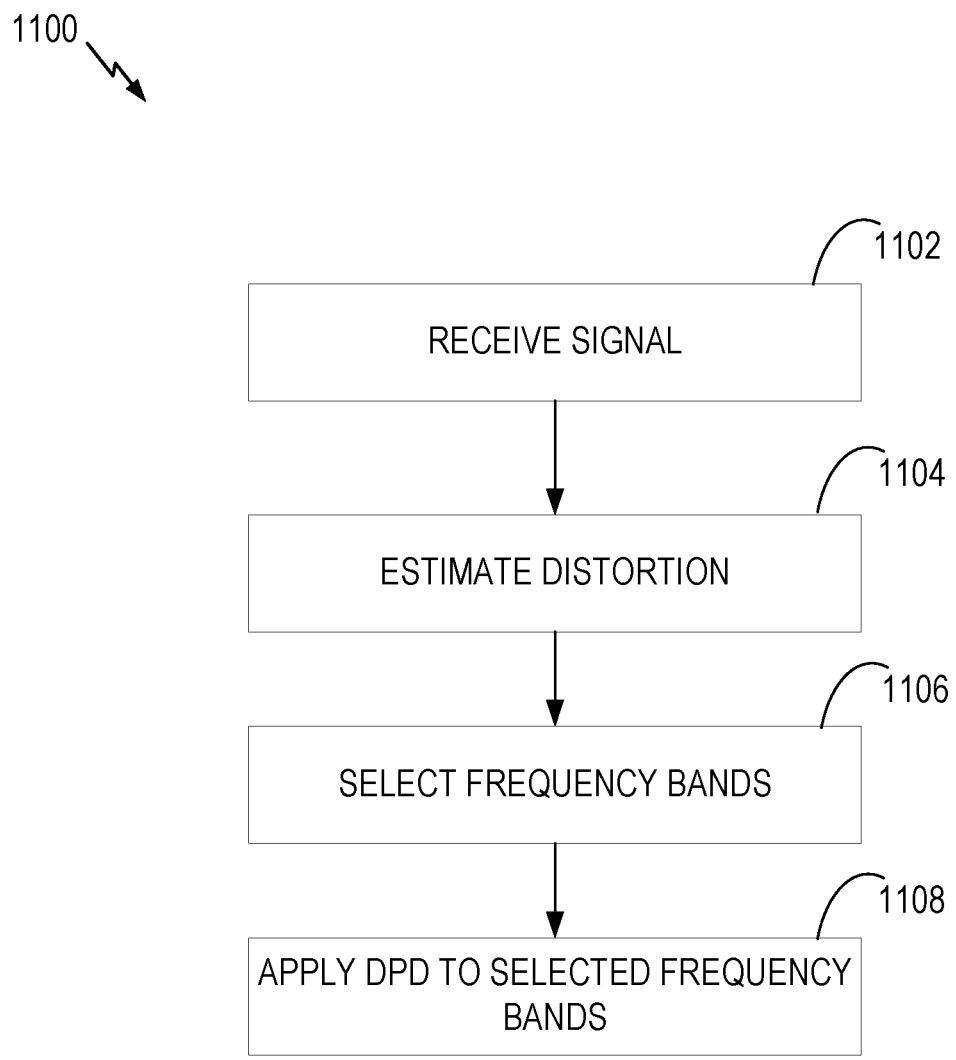
FIG. 11 depicts example operations of a frequency-selective DPD stage.

FIG. 11 depicts example operations 1100 of a frequency-selective DPD stage. The operations 1100 may be implemented by at least one stage 1010 of the iterative frequency-selective DPD circuit stages 1010 depicted in FIG. 10.

At block 1102, the stage receives a generated signal. At block 1104, the stage estimates distortion in the output from the PA (e.g., PA 606). In some implementations, the stage (at block 1104) may estimate the distortion based on a PA model (e.g., model of the PA 606) and by estimating the Bussgang coefficient. The PA model may model the PA output by performing summation of the kernels (with/without memory) with a set of estimated coefficients. In some examples, the output of the PA, y, is modeled according to:

$$y = PA(x) = \alpha x + d,$$

where x is the input signal to the PA, PA(x) is the signal output from the PA, $\alpha$ is a scaling factor called the Bussgang coefficient, and d is the non-linear distortion due to the PA. The Bussgang coefficient may be estimated as:

$$\alpha = \frac{\sum_{n=0}^{N-1} x_n \cdot y_n^*}{\sum_{n=0}^{N-1} |x_n|^2},$$

where x is the input and y is the output of the PA model, and n is the number of samples.

At block 1106, the stage selects one or more frequency bands to mitigate distortion in the output of the PA. In some implementations, the stage may determine the frequency bands (e.g., CCs) to mitigate distortion using a criteria filter (e.g., bandpass filter, low pass filter, etc.) that selects what part of non-linear distortion in the selected frequency bands to mitigate. The one or more frequency bands may be selected based on one or more predetermined conditions. In one aspect, the predetermined condition includes a MCS assigned to the one or more frequency bands that is greater than (or equal to) a threshold MCS value. In one aspect, the predetermined condition includes a target EVM for the one or more frequency bands that is less than (or equal to) a threshold EVM. In one aspect, the predetermined condition includes a transmission power level allocated to the one or more frequency bands that is less than (or equal to) a threshold transmission power level. In one aspect, the predetermined condition includes a lowest transmission power level allocated to the one or more frequency bands among a set of frequency bands of the transmission signal.

At block 1108, the stage applies DPD to the selected one or more frequency bands. In some implementations, the stage can apply DPD to the selected one or more frequency bands using a frequency-selective additive signal $d_f$ that is applied to the original input signal x in order to generate a resulting signal $x_r$. The resulting signal $x_r$ may then be output to the DAC 604 or to a subsequent stage 1010 (repeating blocks 1102, 1104, 1106, and 1108).

Figure 12A:
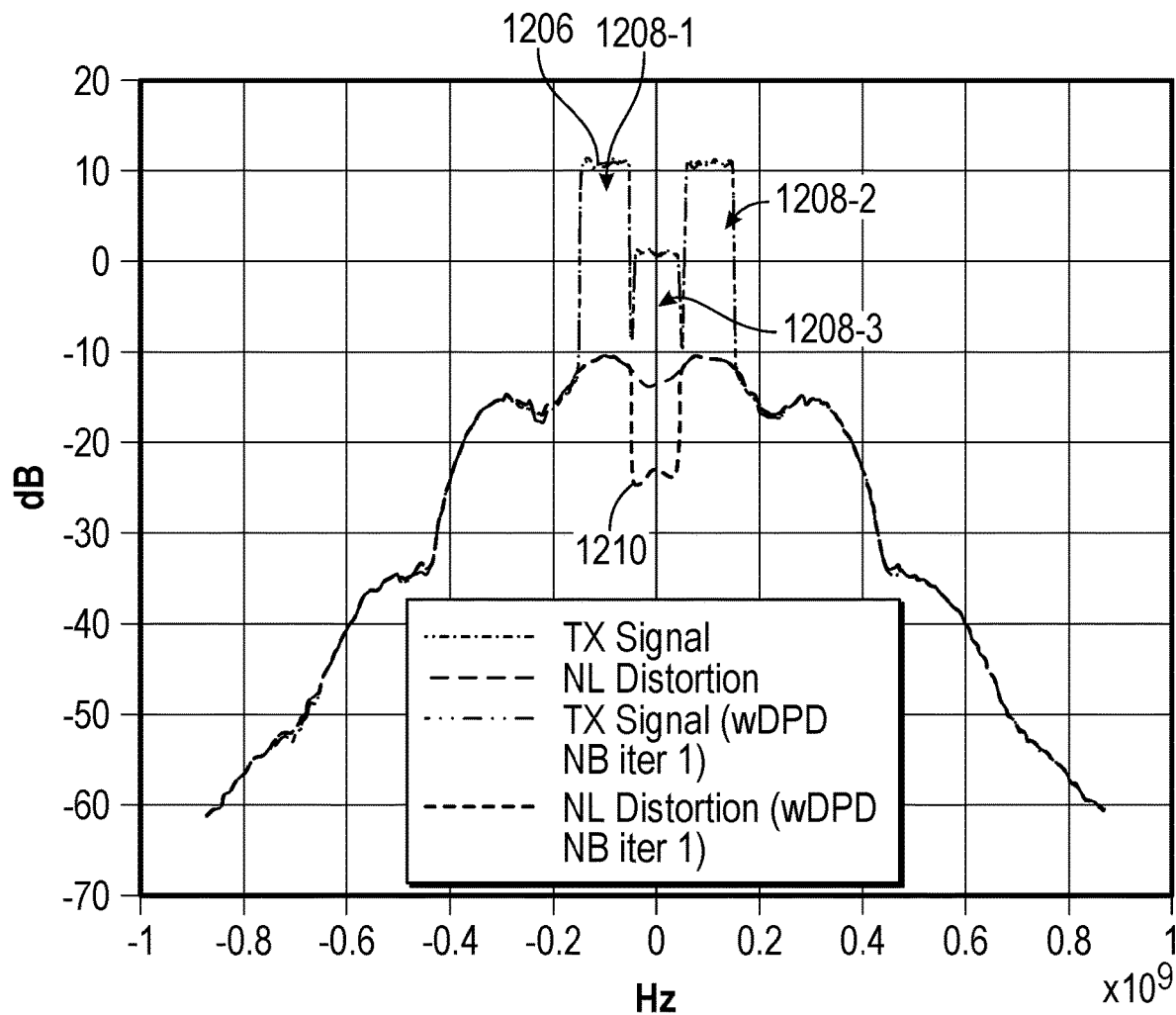
FIG. 12A depicts a focused reduction in non-linear distortion with DPD applied to a targeted component carrier (CC) of a transmission signal, after performing a single stage/iteration of frequency-selective DPD.
Figure 12B:
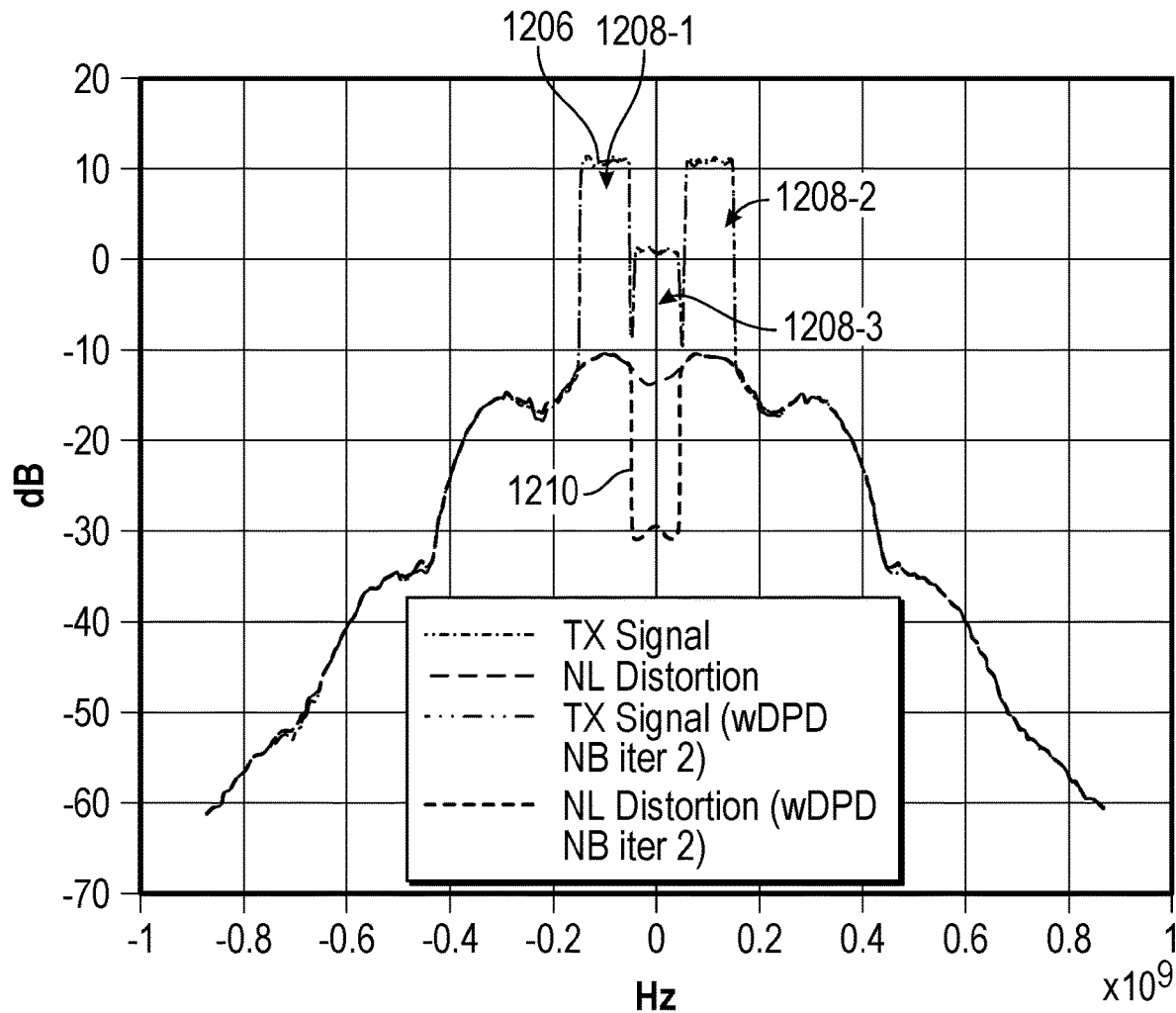
FIG. 12B depicts a focused reduction in non-linear distortion with DPD applied to a targeted CC of a transmission signal, after performing a subsequent second stage/iteration of frequency-selective DPD.

FIG. 12A depicts a focused reduction in non-linear distortion 1210 with DPD applied to a targeted CC 1208-2 out of CCs 1208 1-3 of a transmission signal 1206, after performing single stage/iteration of frequency-selective DPD (e.g., after passing through a first stage 1010-1 of FIG. 10). The CC 1208-2 may be selected as a target CC based on satisfying one or more predetermined conditions (e.g., the CC 1208-2 may be transmitted with a lower power than CCs 1208-1 and 1208-2, the CC 1208-2 may be assigned a MCS that is greater than a threshold MCS, the CC 1208-2 may have a target EVM that is less than a threshold EVM, etc.). FIG. 12B depicts a focused reduction in the non-linear distortion 1210 with DPD applied to the targeted CC 1208-2 of the transmission signal 1206, after performing a subsequent second stage/iteration of frequency-selective DPD (e.g., after passing through a second stage 1010-2). As shown in FIG. 12B, the reduction in non-linear distortion for CC 1208-2 improves with each iteration.

Note that although three CCs are shown in FIGS. 12A and 12B, the frequency-selective DPD described herein may be applied to more or fewer than three CCs. Similarly, while FIGS. 12A and 12B depict two CCs (e.g., CCs 1208-1 and 1208-3) being transmitted with the same power, each of the CCs may be transmitted with a different power. Likewise, each of the CCs may have a respective (different) MCS, a respective (different) target EVM, etc.

Example Operations of Entities in a Communication Network

Figure 13:
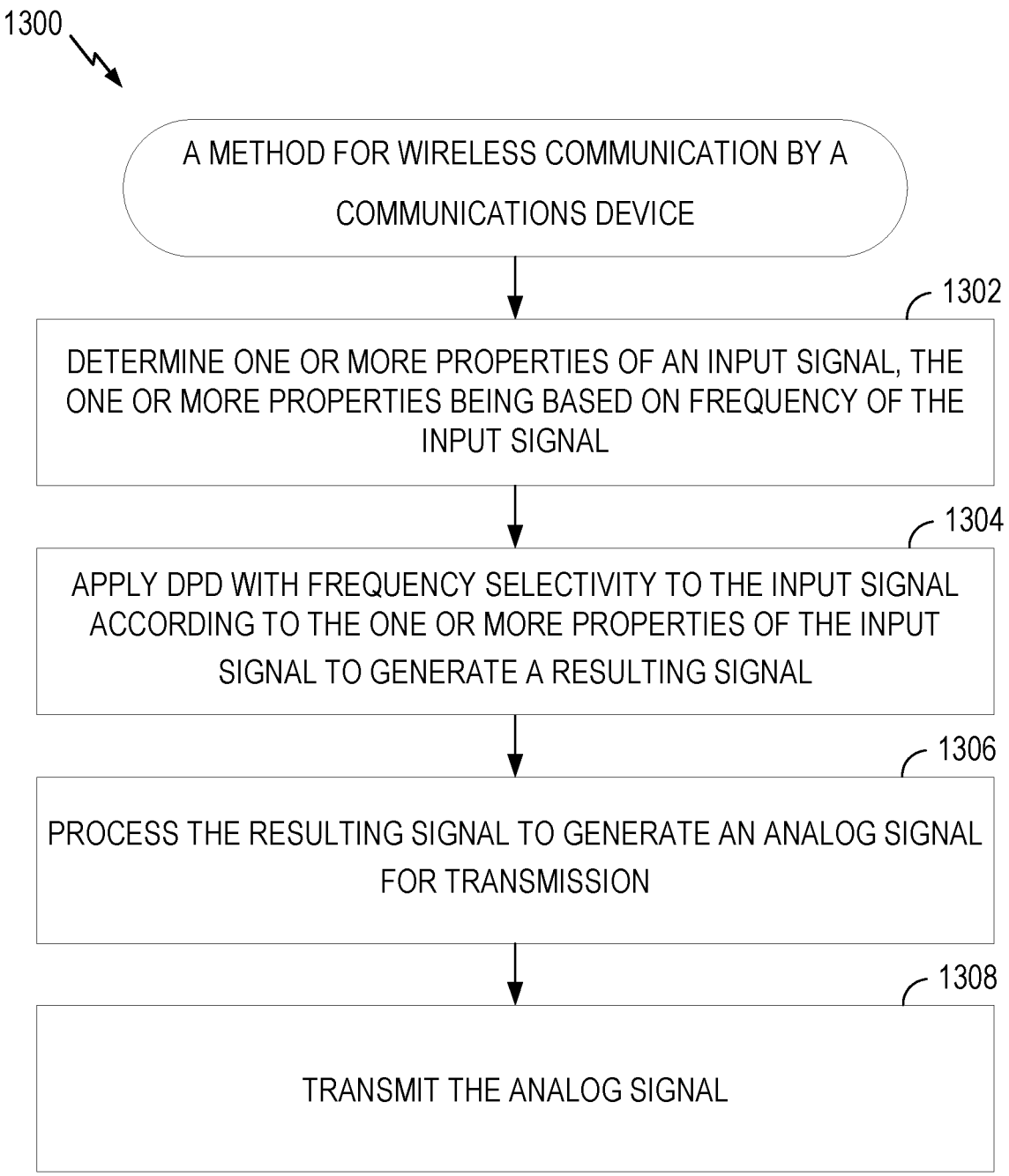
FIG. 13 depicts example operations of a communications device.

FIG. 13 shows a method 1300 for wireless communication by a communications device, such as a UE 104 of FIGS. 1 and 3 or a network entity, such as a BS 102 of FIGS. 1 and 3, or a disaggregated base station as discussed with respect to FIG. 2. The flow diagram includes blocks representing operations in the method 1300.

Method 1300 begins at block 1302 with the communications device determining one or more target parameters of an input signal. The one or more target parameters are based on frequency of the input signal. At block 1304, the communications device applies DPD with frequency selectivity to the input signal according to the one or more target parameters of the input signal to generate a resulting signal. At block 1306, the communications device processes the resulting signal to generate an analog signal for transmission. The processing may include converting to analog, filtering, upconverting, amplifying, etc. For example, the resulting signal may be converted to the analog domain by a DAC (e.g., DAC 604), and processed in the analog domain (e.g., being filtered and upconverted to a RF signal), before being sent to a PA (e.g., PA 606). At block 1308, the communications device transmits the analog signal.

Various aspects relate to the method 1300, including the following aspects.

In one aspect, the input signal includes multiple CCs, and the one or more target parameters include a transmission power level allocated to each of the multiple CCs. In certain aspects, at least two of the multiple CCs are allocated with different transmission power levels.

In one aspect, the input signal includes multiple CCs, and the one or more target parameters include a respective MCS assigned to each of the multiple CCs. In certain aspects, at least two of the multiple CCs are assigned different MCSs.

In one aspect, the input signal includes multiple CCs, and the one or more target parameters include a respective target EVM for each of the multiple CCs. In certain aspects, at least two of the multiple CCs have different target EVMs.

In one aspect, the input signal includes multiple CCs. In this aspect, method 1300 further includes selecting a CC that satisfies a predetermined condition. In one aspect, applying DPD with frequency selectivity (at block 1304) may include applying DPD to impact the selected CC, even though the DPD may be applied in the time domain for all CCs. In one aspect, applying DPD with frequency selectivity (at block 1304) may include refraining from applying DPD to impact a non-selected CC.

In one aspect, the predetermined condition includes a MCS assigned to the selected CC that is greater than a threshold MCS value. In one aspect, the predetermined condition includes a target EVM of the selected CC that is less than a threshold EVM. In one aspect, the predetermined condition includes a transmission power level allocated to the selected CC that is less than a threshold transmission power level. In one aspect, the predetermined condition includes a lowest transmission power level allocated to the selected CC among the CCs.

Note that FIG. 13 is just one example of a method, and other methods including fewer, additional, or alternative processes are possible consistent with this disclosure.

Figure 14:
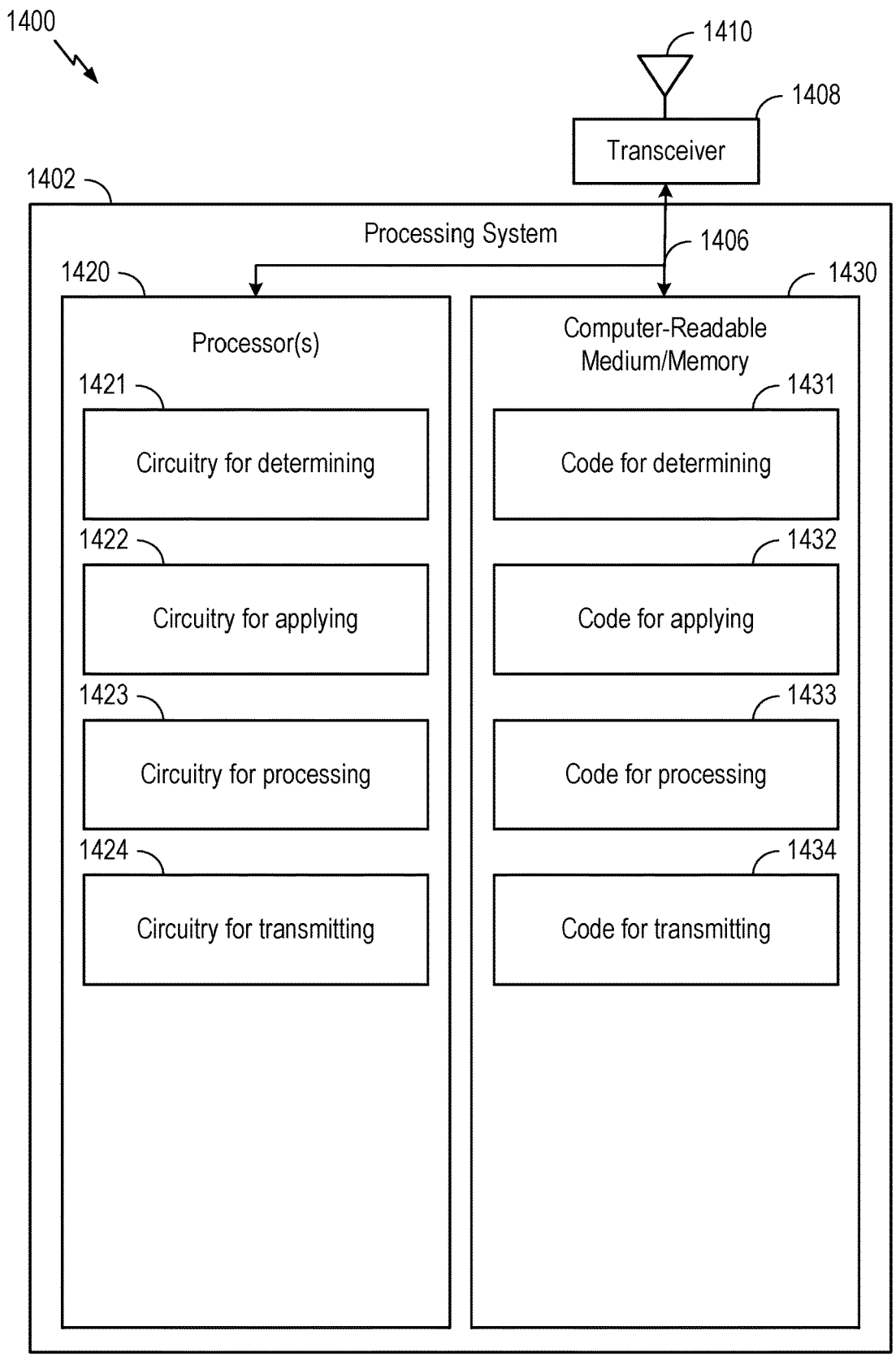
FIG. 14 depicts aspects of an example communications device.

FIG. 14 depicts an example communications device 1400 that includes various components operable, configured, or adapted to perform operations for the techniques disclosed herein, such as the operations depicted and described with respect to FIG. 13. In some examples, communications device 1400 may be a BS 102 as described, for example with respect to FIGS. 1 and 3. In some examples, communications device 1400 may be a UE 104 as described, for example with respect to FIGS. 1 and 3.

Communications device 1400 includes a processing system 1402 coupled to a transceiver 1408 (e.g., a transmitter and/or a receiver). Transceiver 1408 is configured to transmit (or send) and receive signals for the communications device 1400 via an antenna 1410, such as the various signals as described herein. Processing system 1402 may be configured to perform processing functions for communications device 1400, including processing signals received and/or to be transmitted by communications device 1400.

Processing system 1402 includes one or more processors 1420 coupled to a computer-readable medium/memory 1430 via a bus 1406. In certain aspects, computer-readable medium/memory 1430 is configured to store instructions (e.g., computer-executable code) that when executed by the one or more processors 1420, cause the one or more processors 1420 to perform the operations illustrated in FIG. 13, or other operations for performing the various techniques discussed herein for applying DPD with frequency selectivity.

In the depicted example, computer-readable medium/memory 1430 stores code 1431 for determining one or more properties of an input signal, code 1432 for applying digital pre-distortion with frequency selectivity to the input signal, code 1433 for processing the resulting signal to generate an analog signal for transmission, and code 1434 for transmitting the analog signal.

In the depicted example, the one or more processors 1420 include circuitry configured to implement the code stored in the computer-readable medium/memory 1430, including circuitry 1421 for determining one or more properties of an input signal, circuitry 1422 for applying digital pre-distortion with frequency selectivity to the input signal, circuitry 1423 for processing the resulting signal to generate an analog signal for transmission, and circuitry 1424 for transmitting the analog signal.

Various components of communications device 1400 may provide means for performing the methods described herein, including with respect to FIG. 13.

In some examples, means for transmitting or sending (or means for outputting for transmission) may include: the transceivers 332 and/or antenna(s) 334 of the BS 102 illustrated in FIG. 3; the transceiver 1408 and antenna 1410 of the communications device 1400 in FIG. 14; or the transceivers 354 and/or antenna(s) 352 of the UE 104 illustrated in FIG. 3.

In some examples, means for receiving (or means for obtaining) may include: the transceivers 332 and/or antenna(s) 334 of the base station illustrated in FIG. 3; the transceiver 1408 and antenna 1410 of the communications device 1400 in FIG. 14; and/or the transceivers 354 and/or antenna(s) 352 of the UE 104 illustrated in FIG. 3.

In some cases, rather than actually transmitting, for example, signals and/or data, a device may have an interface to output signals and/or data for transmission (a means for outputting). For example, a processor may output signals and/or data, via a bus interface, to a radio frequency (RF) front end for transmission. Similarly, rather than actually receiving signals and/or data, a device may have an interface to obtain the signals and/or data received from another device (a means for obtaining). For example, a processor may obtain (or receive) the signals and/or data, via a bus interface, from an RF front end for reception. In various aspects, an RF front end may include various components, including transmit and receive processors, transmit and receive MIMO processors, modulators, demodulators, and the like, such as depicted in the examples in FIG. 3.

In some examples, means for determining, means for applying, and means for processing may include various processing system components, such as: the one or more processors 1420 in FIG. 14, or aspects of the BS 102 depicted in FIG. 3, including receive processor 338, transmit processor 320, TX MIMO processor 330, and/or controller/processor 340; or aspects of the UE 104 depicted in FIG. 3, including receive processor 358, transmit processor 364, TX MIMO processor 366, and/or controller/processor 380.

Notably, FIG. 14 is an example, and many other examples and configurations of communications device 1400 are possible.

EXAMPLE CLAUSES

Implementation examples are described in the following numbered clauses:

Clause 1: A method for wireless communication by a communications device, comprising: determining one or more target parameters of an input signal, the one or more target parameters being based on frequency of the input signal; applying digital pre-distortion with frequency selectivity to the input signal according to the one or more target parameters of the input signal to generate a resulting signal; processing the resulting signal to generate an analog signal for transmission; and transmitting the analog signal.

Clause 2: The method according to Clause 1, wherein the input signal comprises a plurality of component carriers.

Clause 3: The method according to Clause 2, wherein the one or more target parameters comprise a respective transmission power level allocated to each of the plurality of component carriers and wherein at least two of the plurality of component carriers are allocated different transmission power levels.

Clause 4: The method according to any of Clauses 2-3, wherein the one or more target parameters comprise a respective modulation and coding scheme assigned to each of the plurality of component carriers and wherein at least two of the plurality of component carriers are assigned different modulation and coding schemes.

Clause 5: The method according to any of Clauses 2-4, wherein the one or more target parameters comprise a respective target error vector magnitude for each of the plurality of component carriers and wherein at least two of the plurality of component carriers have different target error vector magnitudes.

Clause 6: The method according to any of Clauses 2-5, further comprising: selecting, from the plurality of component carriers of the input signal, a component carrier that satisfies a predetermined condition, wherein applying digital pre-distortion with frequency selectivity comprises: applying the digital pre-distortion to affect the selected component carrier.

Clause 7: The method according to Clause 6, wherein applying digital pre-distortion with frequency selectivity comprises: refraining from applying digital pre-distortion to affect a non-selected component carrier of the plurality of component carriers.

Clause 8: The method according to any of Clauses 6-7, wherein the predetermined condition comprises a modulation and coding scheme (MCS) assigned to the selected component carrier that is greater than a threshold MCS value.

Clause 9: The method according to any of Clauses 6-8, wherein the predetermined condition comprises a target error vector magnitude of the selected component carrier that is less than a threshold error vector magnitude.

Clause 10: The method according to any of Clauses 6-9, wherein the predetermined condition comprises a transmission power level allocated to the selected component carrier that is less than a threshold transmission power level.

Clause 11: The method according to any of Clauses 6-10, wherein the predetermined condition comprises a lowest transmission power level allocated to the selected component carrier among the plurality of component carriers.

Clause 12: The method according to any of Clauses 1-11, wherein the communications device is a user equipment.

Clause 13: The method according to any of Clauses 1-11, wherein the communications device is a network entity.

Clause 14: A communications device configured for wireless communications, comprising: a memory comprising computer-executable instructions; and a processor configured to execute the computer-executable instructions and cause the communications device to perform a method in accordance with any one of Clauses 1-13.

Clause 15: An apparatus, comprising means for performing a method in accordance with any one of Clauses 1-13.

Clause 16: A non-transitory computer-readable medium comprising executable instructions that, when executed by a processor of an apparatus, cause the apparatus to perform a method in accordance with any one of Clauses 1-13.

Clause 17: A computer program product embodied on a computer-readable storage medium comprising code for performing a method in accordance with any one of Clauses 1-13.

Additional Considerations

The preceding description is provided to enable any person skilled in the art to practice the various aspects described herein. The examples discussed herein are not limiting of the scope, applicability, or aspects set forth in the claims. Various modifications to these aspects will be readily apparent to those skilled in the art, and the general principles defined herein may be applied to other aspects. For example, changes may be made in the function and arrangement of elements discussed without departing from the scope of the disclosure. Various examples may omit, substitute, or add various procedures or components as appropriate. For instance, the methods described may be performed in an order different from that described, and various actions may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, a system on a chip (SoC), or any other such configuration.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more actions for achieving the methods. The method actions may be interchanged with one another without departing from the scope of the claims. In other words, unless a specific order of actions is specified, the order and/or use of specific actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor.

The following claims are not intended to be limited to the aspects shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for". All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A communications device comprising:
   a memory comprising computer-executable instructions; and
   one or more processors configured to execute the computer-executable instructions and cause the communications device to:
      determine one or more target parameters of an input signal, the one or more target parameters being based on frequency of the input signal;
      select, from a plurality of component carriers of the input signal, a component carrier that satisfies a predetermined condition;
      apply digital pre-distortion with frequency selectivity to the input signal according to the one or more target parameters of the input signal to affect the selected component carrier and to generate a resulting signal;
      process the resulting signal to generate an analog signal for transmission; and
      transmit the analog signal.

2. The communications device of claim 1, wherein the one or more target parameters comprise a respective transmission power level allocated to each of the plurality of component carriers and wherein at least two of the plurality of component carriers are allocated different transmission power levels.

3. The communications device of claim 1, wherein the one or more target parameters comprise a respective modulation and coding scheme assigned to each of the plurality of component carriers and wherein at least two of the plurality of component carriers are assigned different modulation and coding schemes.

4. The communications device of claim 1, wherein the one or more target parameters comprise a respective target error vector magnitude for each of the plurality of component carriers and wherein at least two of the plurality of component carriers have different target error vector magnitudes.

5. The communications device of claim 1, wherein to apply the digital pre-distortion with frequency selectivity, the one or more processors are configured to cause the communications device to refrain from applying digital pre-distortion to affect a non-selected component carrier of the plurality of component carriers.

6. The communications device of claim 1, wherein the predetermined condition comprises a modulation and coding scheme (MCS) assigned to the selected component carrier that is greater than a threshold MCS value.

7. The communications device of claim 1, wherein the predetermined condition comprises a target error vector magnitude of the selected component carrier that is less than a threshold error vector magnitude.

8. The communications device of claim 1, wherein the predetermined condition comprises a transmission power level allocated to the selected component carrier that is less than a threshold transmission power level.

9. The communications device of claim 1, wherein the predetermined condition comprises a lowest transmission power level allocated to the selected component carrier among the plurality of component carriers.

10. The communications device of claim 1, wherein the communications device is a user equipment.

11. The communications device of claim 1, wherein the communications device is a network entity.

12. A method for wireless communications by a communications device, comprising:
- determining one or more target parameters of an input signal, the one or more target parameters being based on frequency of the input signal;
- selecting, from a plurality of component carriers of the input signal, a component carrier that satisfies a predetermined condition;
- applying digital pre-distortion with frequency selectivity to the input signal according to the one or more target parameters of the input signal to affect the selected component carrier and to generate a resulting signal;
- processing the resulting signal to generate an analog signal for transmission; and
- transmitting the analog signal.

13. The method of claim 12, wherein the one or more target parameters comprise a respective transmission power level allocated to each of the plurality of component carriers and wherein at least two of the plurality of component carriers are allocated different transmission power levels.

14. The method of claim 12, wherein the one or more target parameters comprise a respective modulation and coding scheme assigned to each of the plurality of component carriers and wherein at least two of the plurality of component carriers are assigned different modulation and coding schemes.

15. The method of claim 12, wherein the one or more target parameters comprise a respective target error vector magnitude for each of the plurality of component carriers and wherein at least two of the plurality of component carriers have different target error vector magnitudes.

16. The method of claim 12, wherein the predetermined condition comprises at least one of: (i) a modulation and coding scheme (MCS) assigned to the selected component carrier that is greater than a threshold MCS value or (ii) a target error vector magnitude of the selected component carrier that is less than a threshold error vector magnitude.

17. The method of claim 12, wherein applying the digital pre-distortion with frequency selectivity comprises refraining from applying digital pre-distortion to affect a non-selected component carrier of the plurality of component carriers.

18. The method of claim 12, wherein the predetermined condition comprises a transmission power level allocated to the selected component carrier that is less than a threshold transmission power level.

19. The method of claim 12, wherein the predetermined condition comprises a lowest transmission power level allocated to the selected component carrier among the plurality of component carriers.

20. The method of claim 12, wherein the communications device is a user equipment.

* * * * *